United States Patent
Kurokawa

(10) Patent No.: US 9,385,054 B2
(45) Date of Patent: Jul. 5, 2016

(54) DATA PROCESSING DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/533,370

(22) Filed: Nov. 5, 2014

(65) Prior Publication Data
US 2015/0131356 A1    May 14, 2015

(30) Foreign Application Priority Data
Nov. 8, 2013    (JP) .................. 2013-231864

(51) Int. Cl.
*G11C 29/00* (2006.01)
*H01L 21/66* (2006.01)
(Continued)

(52) U.S. Cl.
CPC ...... *H01L 22/20* (2013.01); *G11C 5/02* (2013.01); *G11C 29/18* (2013.01); *G11C 29/785* (2013.01); *G11C 29/82* (2013.01); *G11C 29/04* (2013.01);
(Continued)

(58) Field of Classification Search
CPC .......... G11C 5/02; G11C 29/02; G11C 29/04; G11C 29/18; G11C 29/78; G11C 29/785; G11C 29/82; G11C 2029/1204; G11C 2029/1802; G11C 2029/4402; H01L 22/20

USPC ............ 365/51, 63, 185.02, 185.09, 200, 201
See application file for complete search history.

(56) References Cited

U.S. PATENT DOCUMENTS 4,860,260 A * 8/1989 Saito .................... G11C 29/781
                                                        365/200
5,469,389 A    11/1995 Olivo et al.
(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Tan T. Nguyen
(74) *Attorney, Agent, or Firm* — Fish & Richardson P.C.

(57) ABSTRACT

A method by which a defective memory cell can be efficiently excluded from a memory cell array is provided. In one embodiment, the memory cell array includes M word lines and (N+K) bit lines. K of the bit lines are spares (i.e., redundant bit lines). Programmable switches in a switch array are programmed so that the switch array connects a driver that drives the bit lines to N bit lines that are not connected to defective memory cells. The memory cell array is tested by a test circuit connected to the bit lines in such a manner that the test circuit transmits and receives a signal to and from the bit lines via the switch array. The test circuit may be formed using a reconfigurable circuit. Other embodiments may be claimed.

17 Claims, 25 Drawing Sheets

(51) Int. Cl.
*G11C 5/02* (2006.01)
*G11C 29/18* (2006.01)
*G11C 29/04* (2006.01)
*G11C 29/12* (2006.01)
*G11C 29/44* (2006.01)

(52) U.S. Cl.
CPC ........ *G11C 29/78* (2013.01); *G11C 2029/1204* (2013.01); *G11C 2029/1802* (2013.01); *G11C 2029/4402* (2013.01)

(56) References Cited

U.S. PATENT DOCUMENTS

| | | | |
|---|---|---|---|
| 5,535,161 A * | 7/1996 | Kato | G11C 29/24 365/189.07 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,792,565 B1 | 9/2004 | Koyama | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,547,753 B2 | 10/2013 | Takemura et al. | |
| 8,675,382 B2 | 3/2014 | Kurokawa | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0122624 A1 | 5/2009 | Nishida | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0212995 A1 | 8/2012 | Kurokawa | |
| 2013/0293263 A1 | 11/2013 | Kurokawa | |
| 2013/0314124 A1 | 11/2013 | Ikeda et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-122935 | 4/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-208795 | 7/2003 |
| JP | 2004-103957 A | 4/2004 |
| JP | 2004-273614 A | 9/2004 |
| JP | 2004-273732 A | 9/2004 |
| JP | 2008-059751 | 3/2008 |
| WO | WO00-62339 | 10/2000 |
| WO | WO-2004/114391 | 12/2004 |

OTHER PUBLICATIONS

Dembo.H et al., "RFCPUs on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2006, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUs on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe; Ga; or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

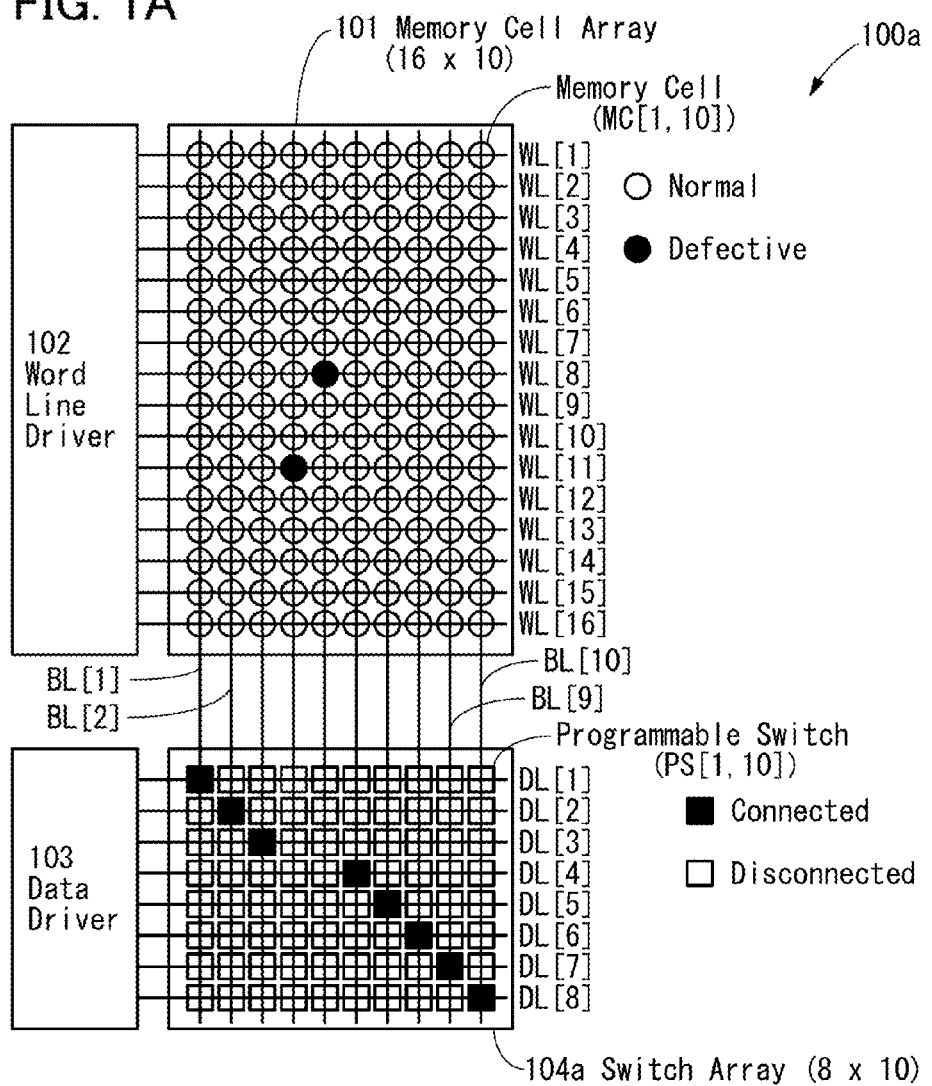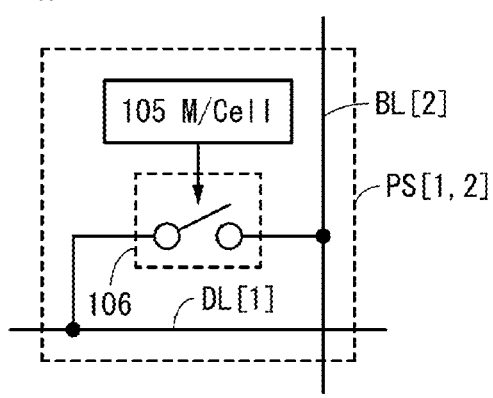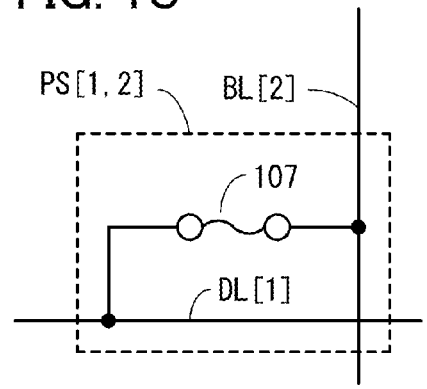

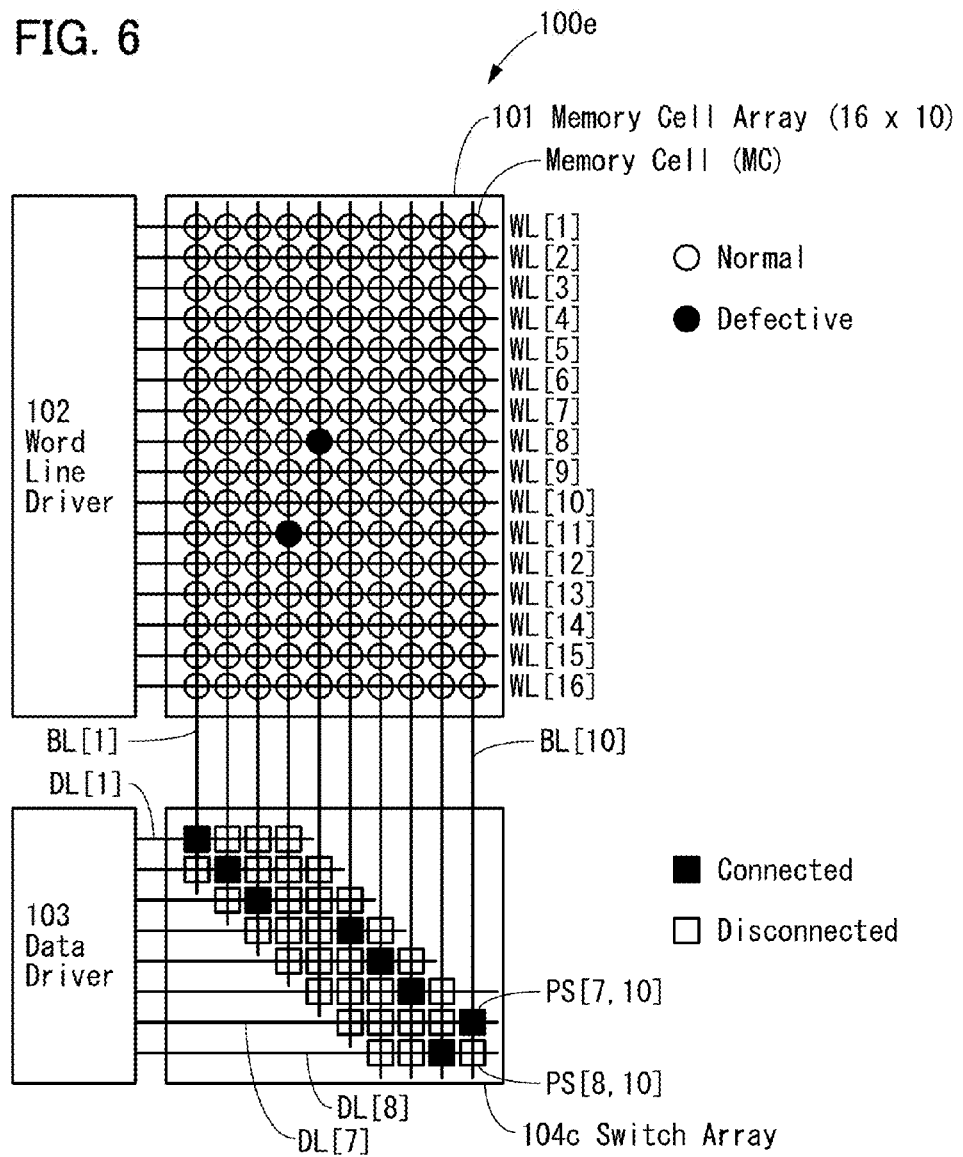

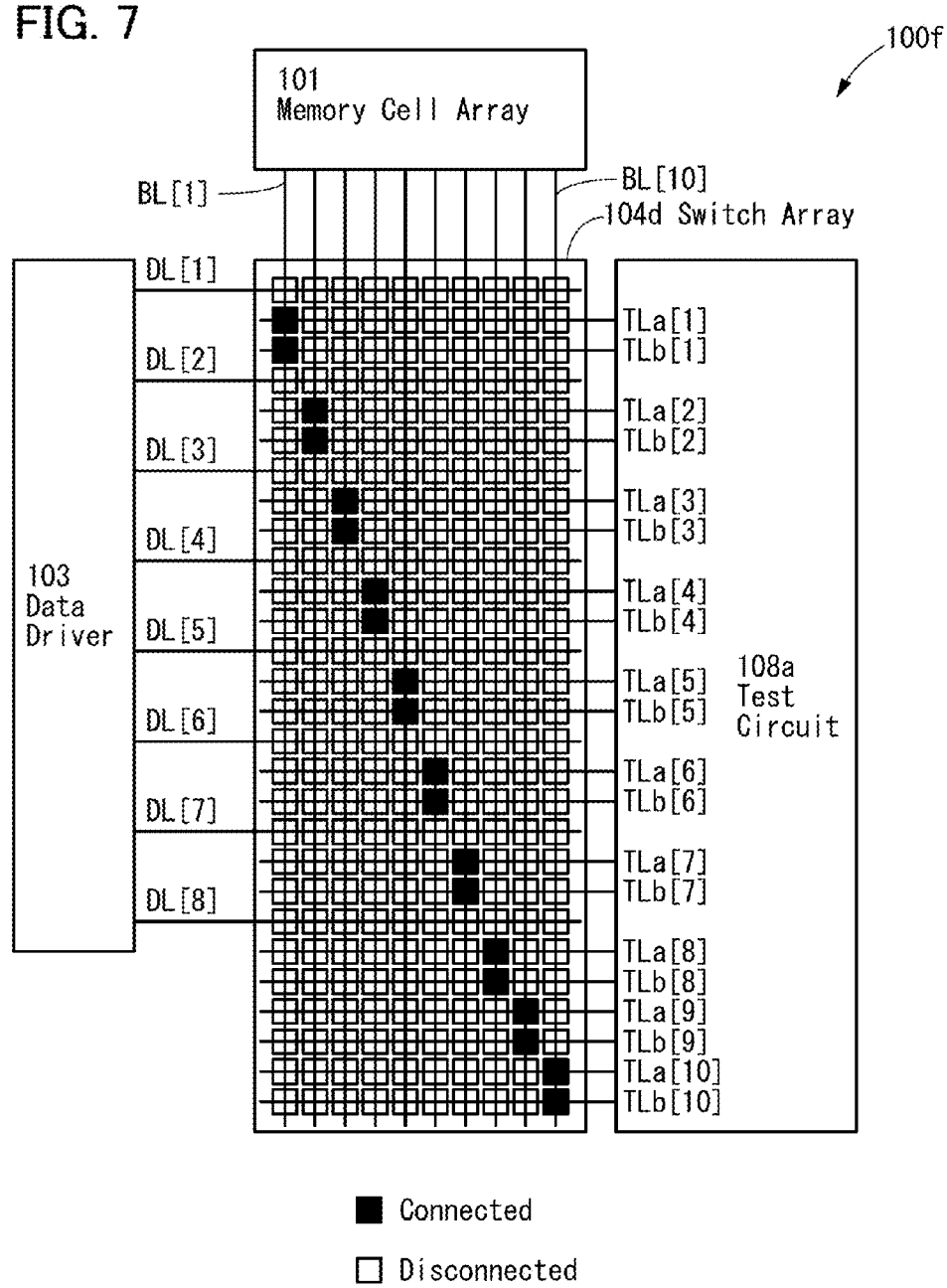

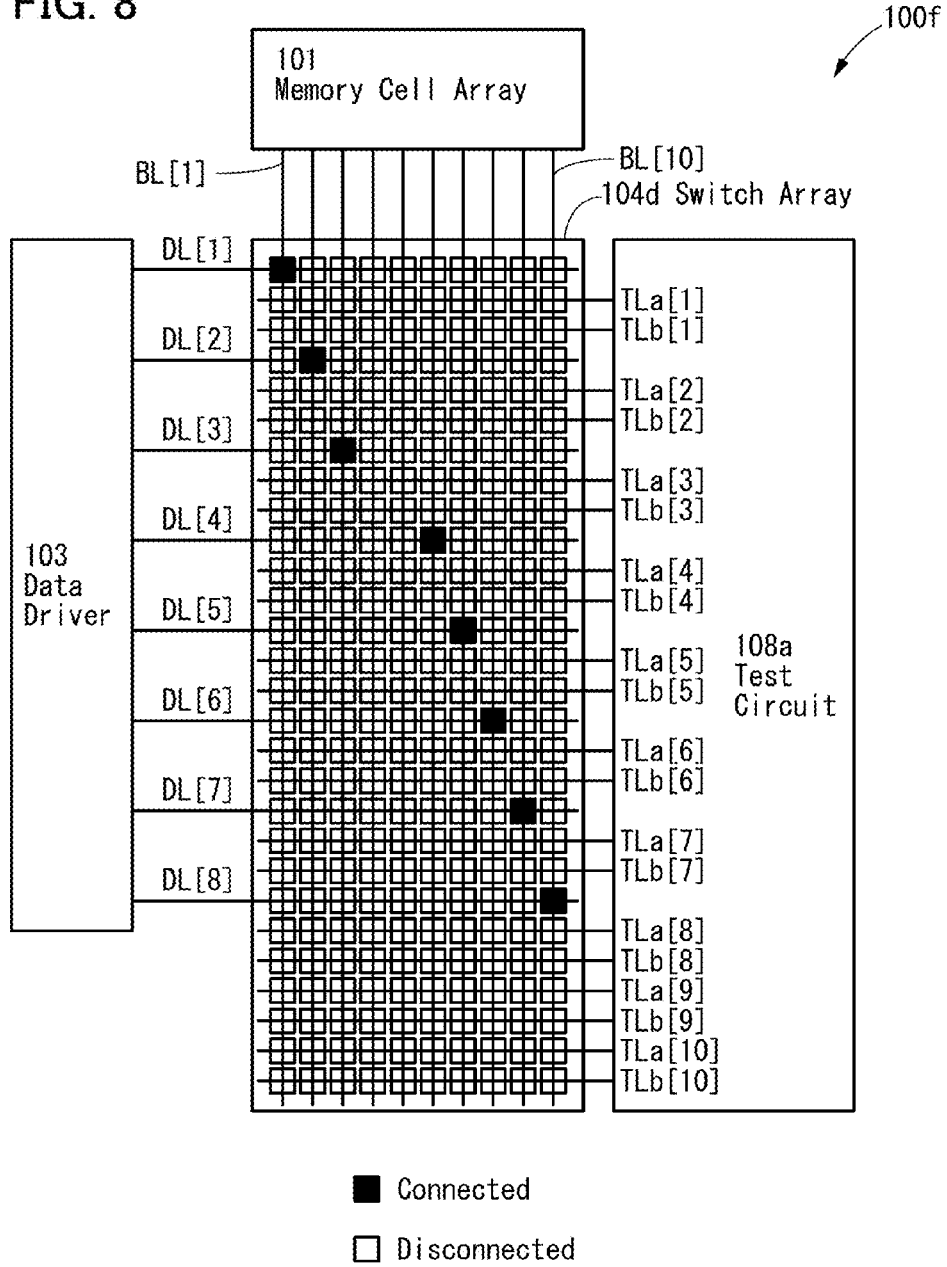

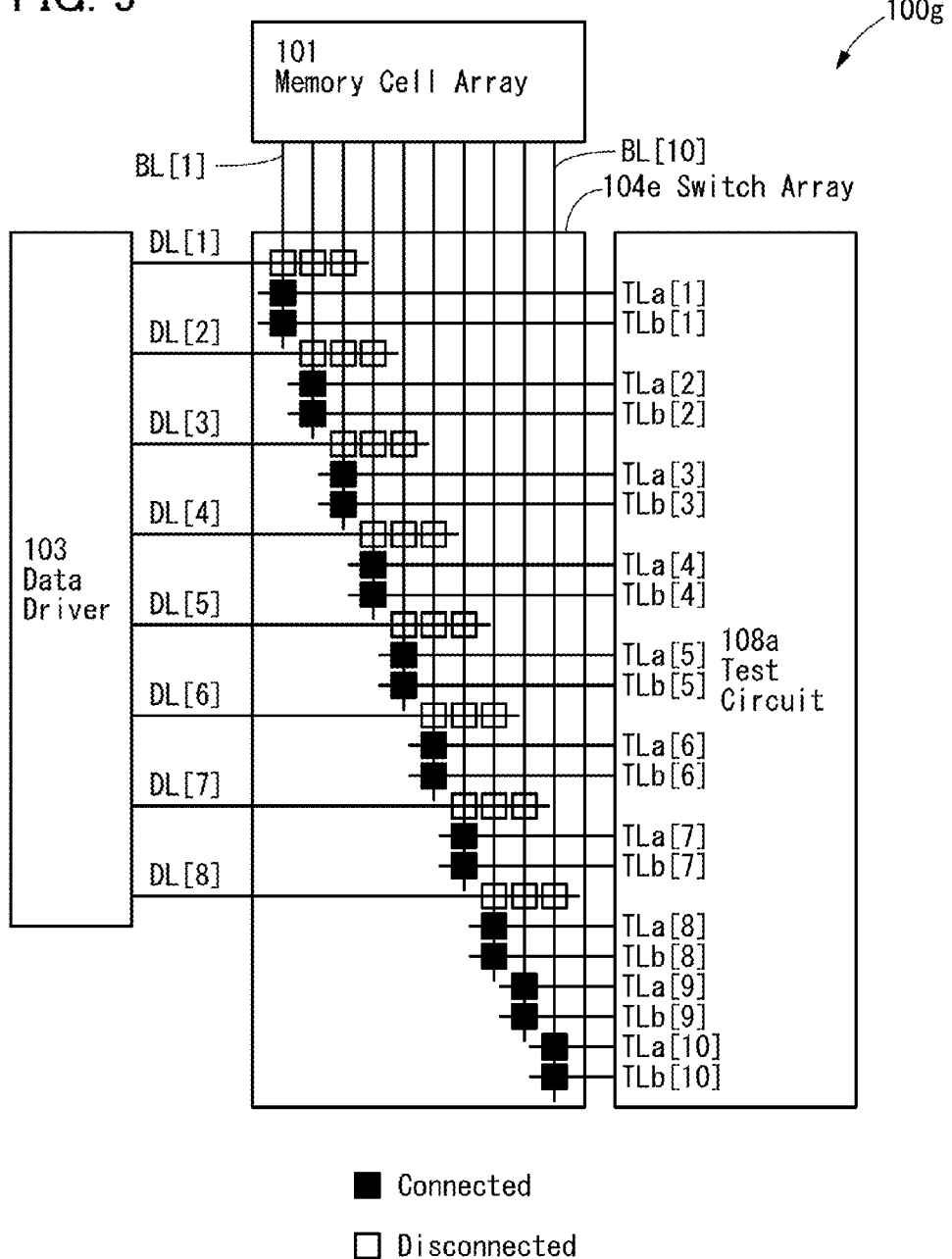

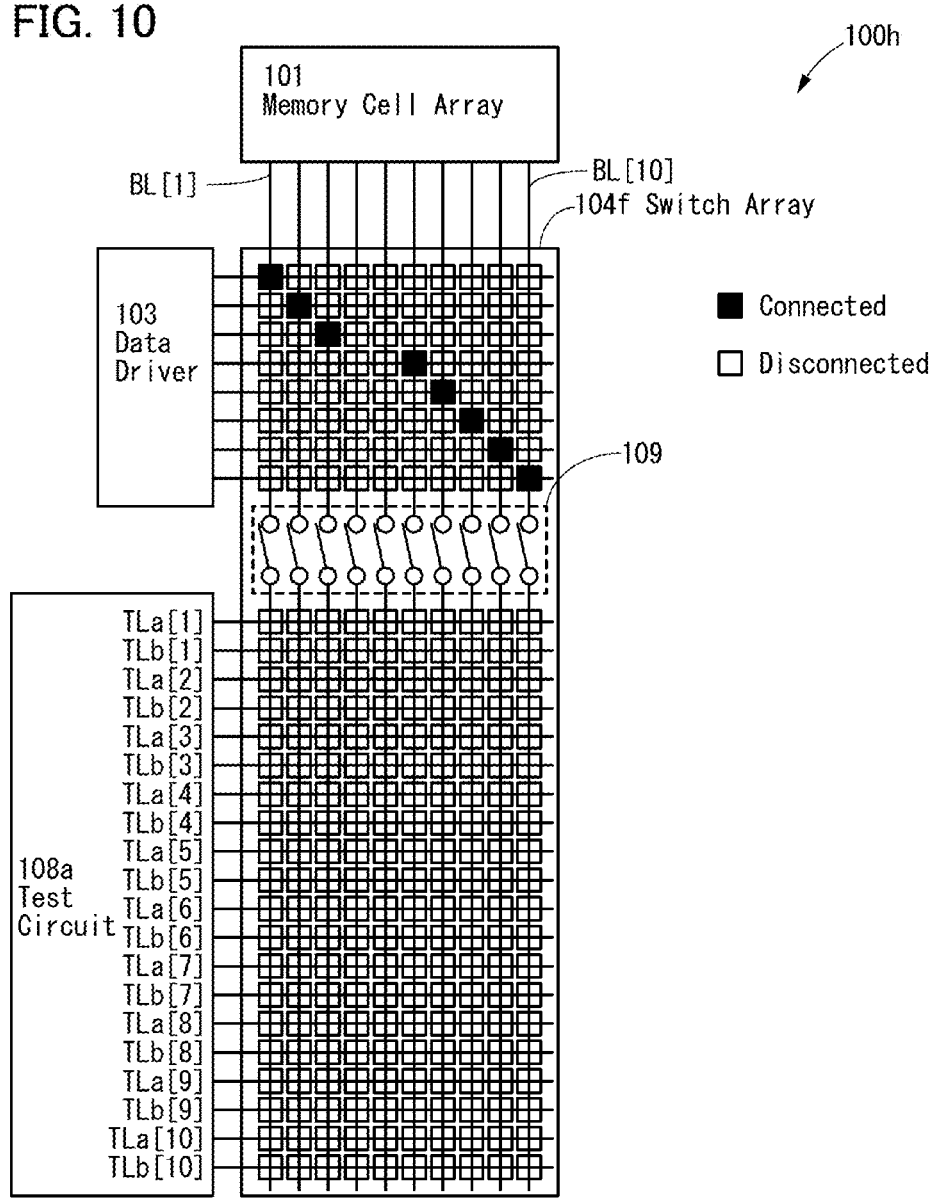

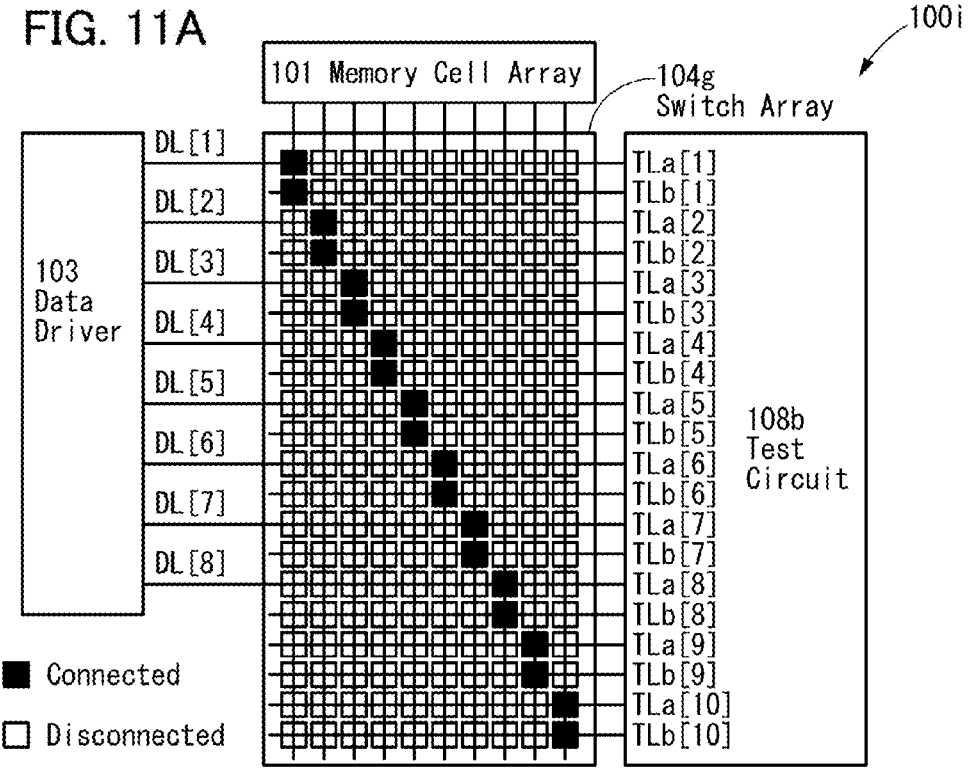
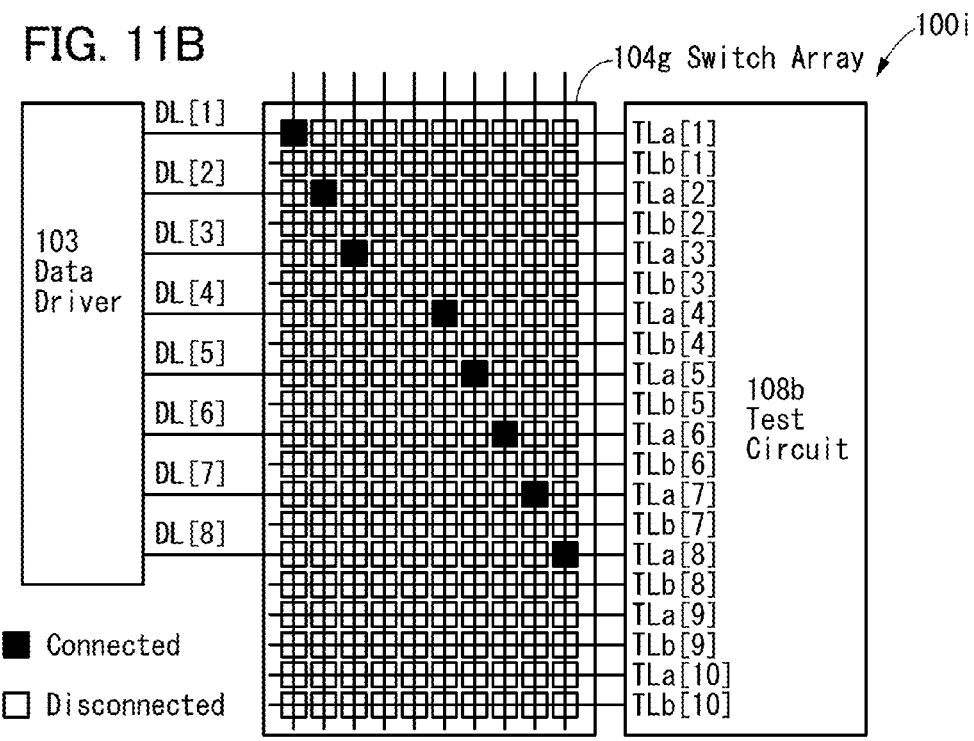

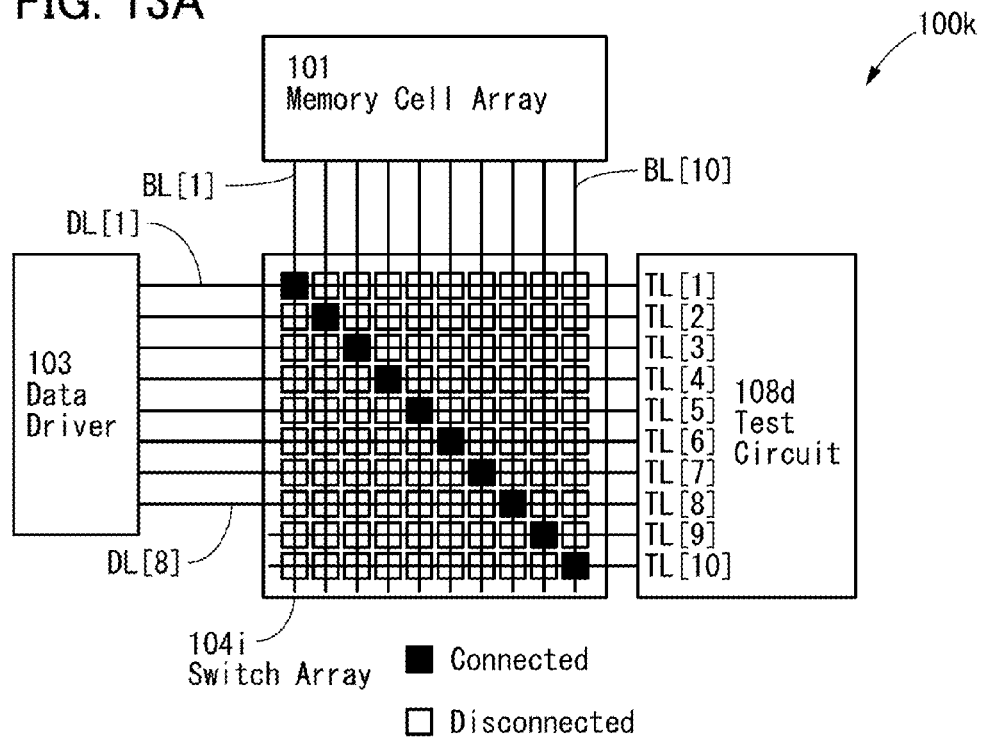
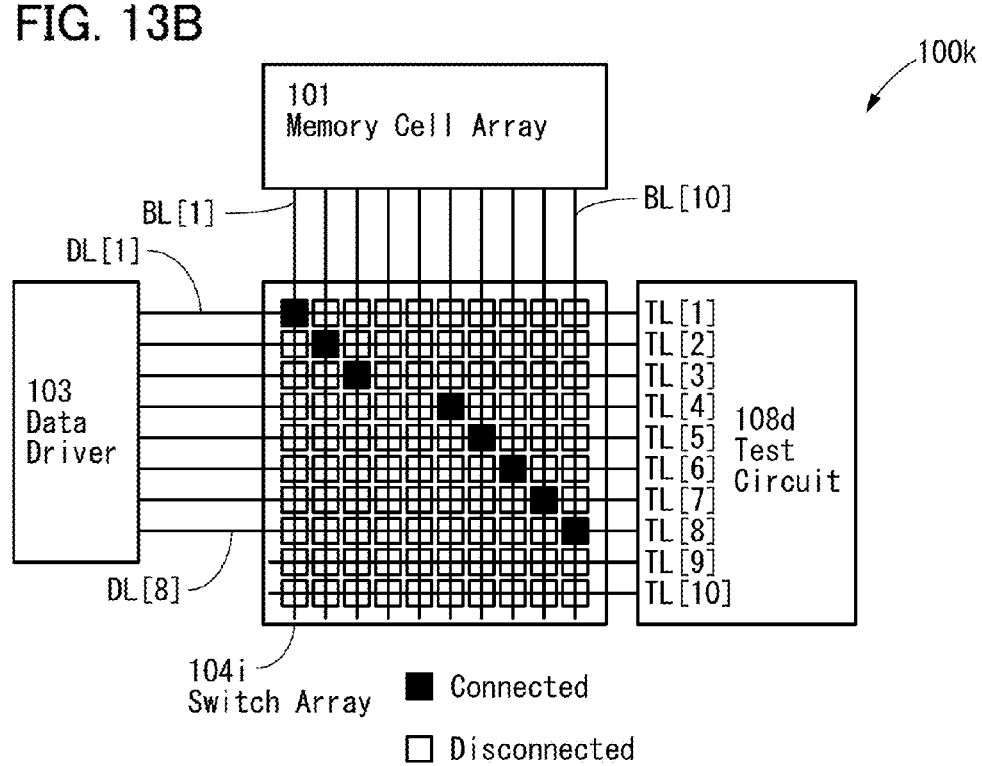

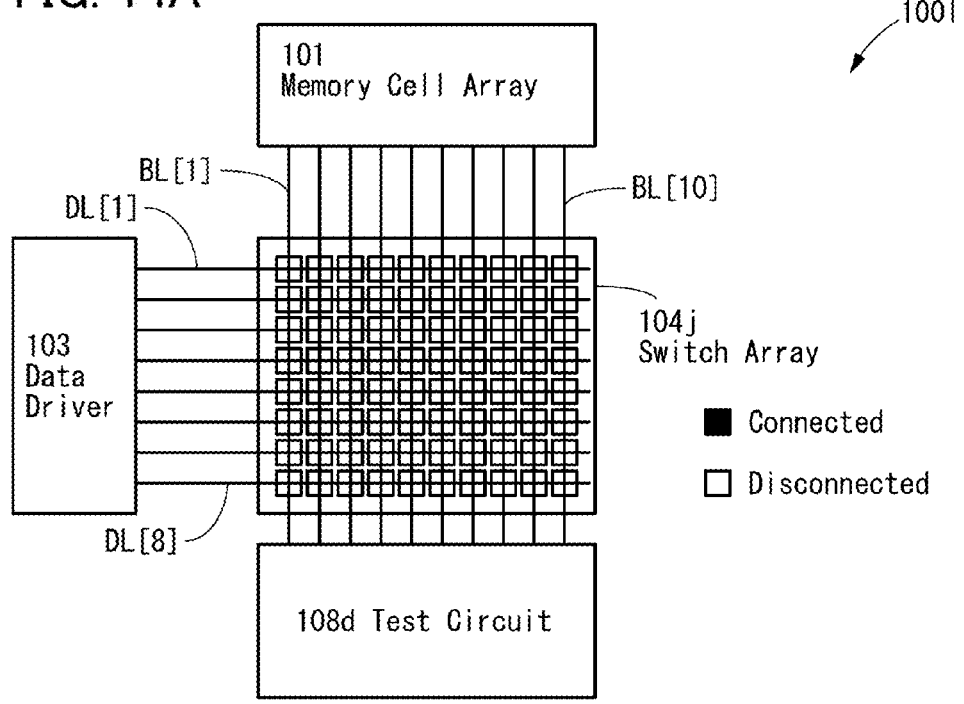
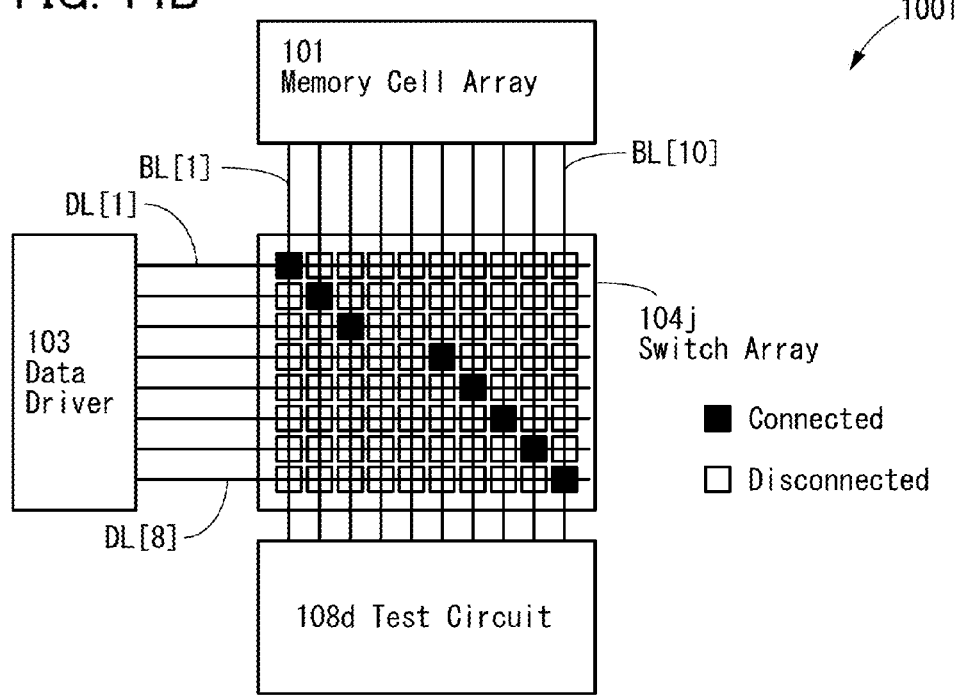

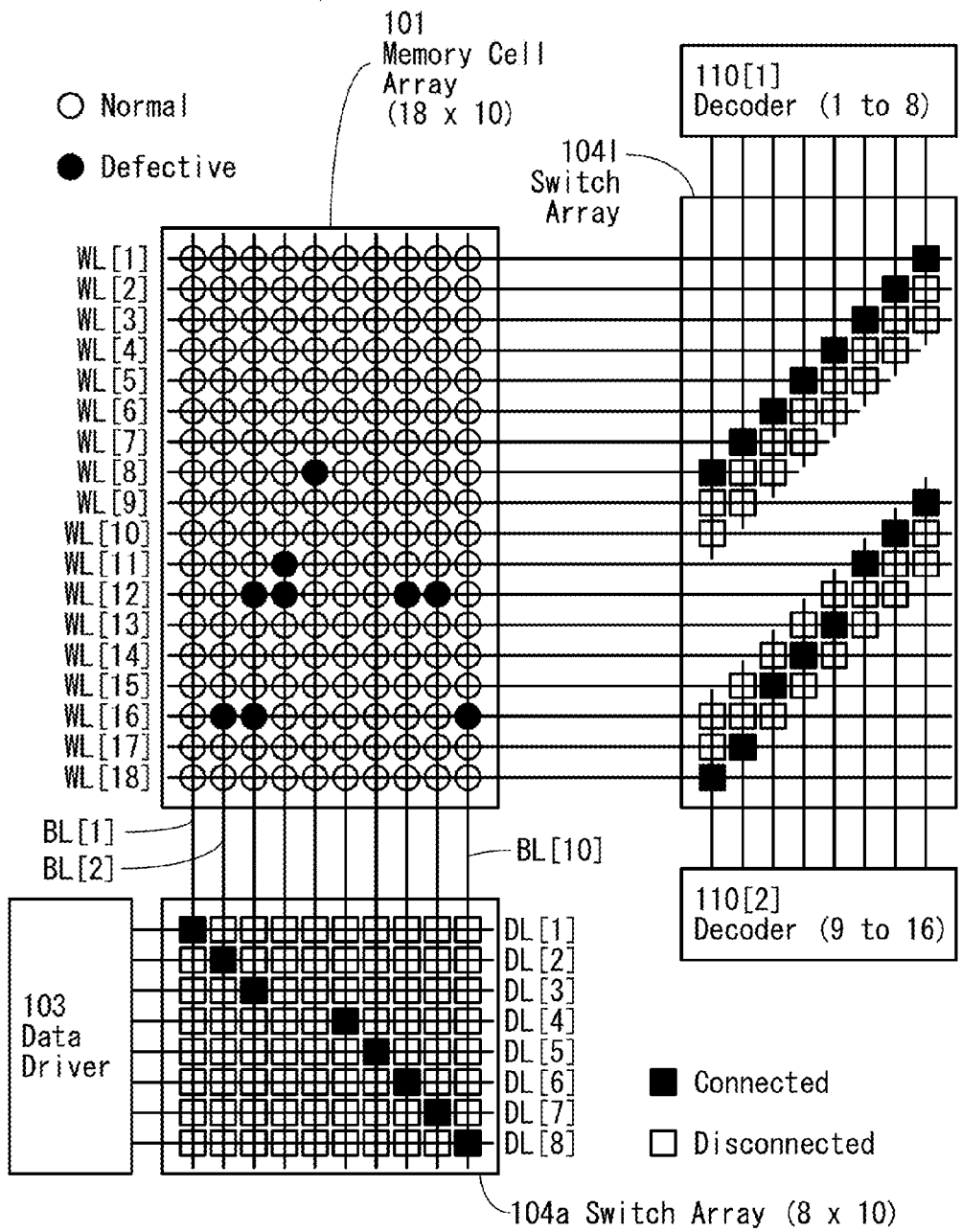

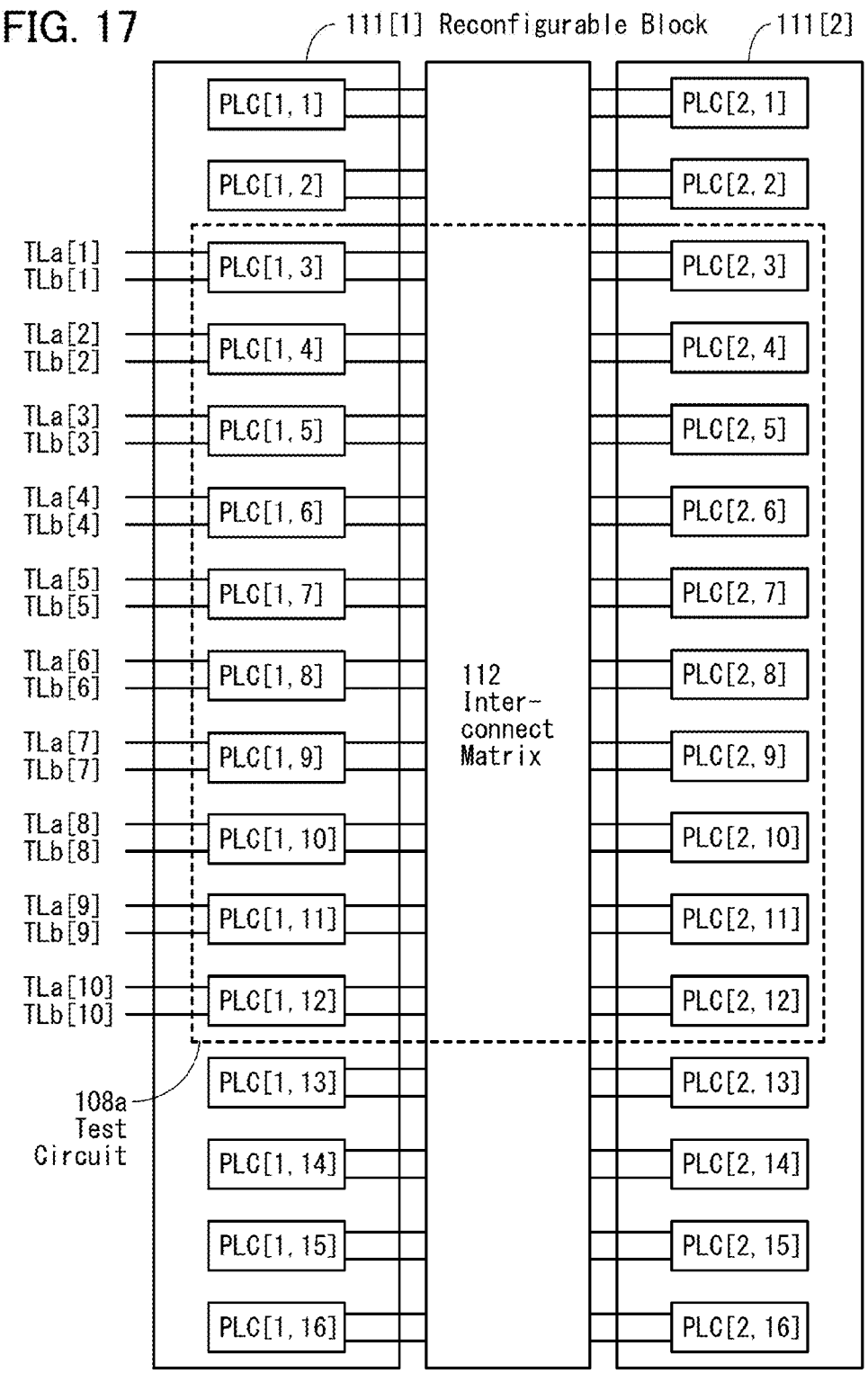

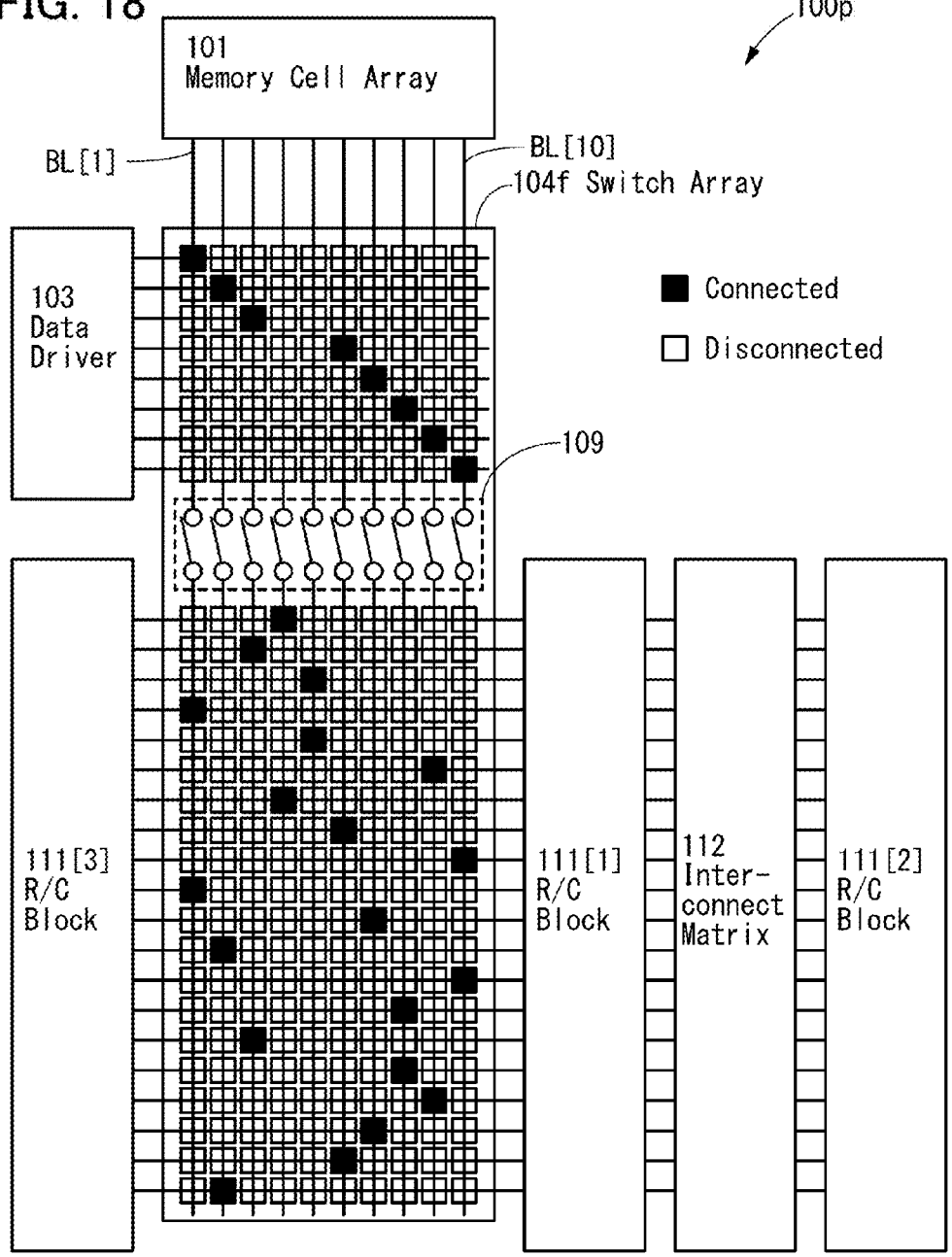

CAAC-OS nc-OS as-sputtered after heat treatment
at 450°C

DATA PROCESSING DEVICE AND MANUFACTURING METHOD THEREOF

BACKGROUND OF THE INVENTION

1. Field of the Invention

One embodiment of the present invention relates to a data processing device.

2. Description of the Related Art

In order to improve manufacturing yield of memory devices such as flash memories, a memory device including a redundant memory cell and a redundant circuit for replacing a defective memory cell with the redundant memory cell has been proposed. Moreover, a memory device including a test circuit for testing memory cells has been proposed.

For example, Patent Document 1 discloses a structure in which a flash memory is provided with a table RAM that converts a logical address into a physical address of a sector, and in order to avoid a physical address of a sector including a defective memory cell (a defective sector), a physical address of a different sector without including a defective memory cell (a normal sector) is substituted.

As a type of semiconductor integrated circuit, a configurable circuit whose circuit function can be changed once or multiple times by programming by a user after shipment is known. Examples of such a configurable circuit are small-scale logics such as a programmable array logic (PAL) and a generic array logic (GAL) and large-scale logics such as a complex programmable logic device (CPLD) and a field programmable gate array (FPGA). Note that a configurable circuit is sometimes called a configurable device or the like and is also a programmable circuit. A circuit whose circuit function can be changed once or multiple times is particularly referred to as a reconfigurable circuit.

One reconfigurable circuit can be used for multiple purposes by rewriting configuration data stored in a configuration memory or changing configuration data read from the configuration memory. For example, Patent Document 2 discloses a method for testing a CPU, an SRAM, and a DRAM in a semiconductor chip by using an FPGA incorporated in the semiconductor chip.

Note that a semiconductor used in such a reconfigurable circuit is not limited to silicon. Examples using an oxide semiconductor are disclosed in Patent Documents 3 and 4, for example.

REFERENCE

Patent Document

[Patent Document 1] Japanese Published Patent Application No. 2000-122935
[Patent Document 2] PCT International Publication No. 00/62339
[Patent Document 3] U.S. Pat. No. 8,547,753
[Patent Document 4] U.S. Pat. No. 8,675,382

SUMMARY OF THE INVENTION

For example, at least one of the following is an object of an embodiment of the present invention: the provision of a reconfigurable circuit capable of easy configuration, the provision of a reconfigurable circuit that is favorable as a redundant circuit of a memory device, the provision of a memory device or a data processing device whose operation time is shortened even though the device is provided with a redundant circuit, the provision of a memory device or a data processing device in which a redundant memory cell can be substituted for a defective memory cell to make efficient use of memory capacity, the provision of a memory device or a data processing device whose manufacturing cost can be reduced even though the device is provided with a test circuit, the provision of a novel data processing device, and one or more objects derived from the description of the specification, the drawings, the claims, and the like.

For example, one embodiment of the present invention is a data processing device which includes a plurality of first wirings; a plurality of second wirings; a plurality of third wirings; a memory cell array including memory cells at intersections between the plurality of first wirings and the plurality of third wirings; a switch array including programmable switches at intersections between the plurality of second wirings and the plurality of third wirings, a first driver circuit configured to supply a signal to the plurality of first wirings; and a second driver circuit configured to supply a signal to the plurality of second wirings. The programmable switches are each capable of connecting one of the plurality of second wirings to one of the plurality of third wirings.

At least one of the above-described objects can be achieved.

BRIEF DESCRIPTION OF THE DRAWINGS

In the accompanying drawings:

FIGS. 1A to 1C illustrate a structural example and an operation example of a data processing device;
FIG. 6 illustrates a structural example and an operation example of a data processing device;
FIG. 7 illustrates a structural example and an operation example of a data processing device;
FIG. 8 illustrates a structural example and an operation example of a data processing device;
FIG. 9 illustrates a structural example and an operation example of a data processing device;
FIG. 10 illustrates a structural example and an operation example of a data processing device;
FIGS. 11A and 11B illustrate a structural example and an operation example of a data processing device;
FIGS. 13A and 13B illustrate a structural example and an operation example of a data processing device;
FIGS. 14A and 14B illustrate a structural example and an operation example of a data processing device;
FIG. 16 illustrates a structural example and an operation example of a data processing device;
FIG. 17 illustrates a structural example of a test circuit;
FIG. 18 illustrates a structural example and an operation example of a data processing device.

DETAILED DESCRIPTION OF THE INVENTION

Figure 2:
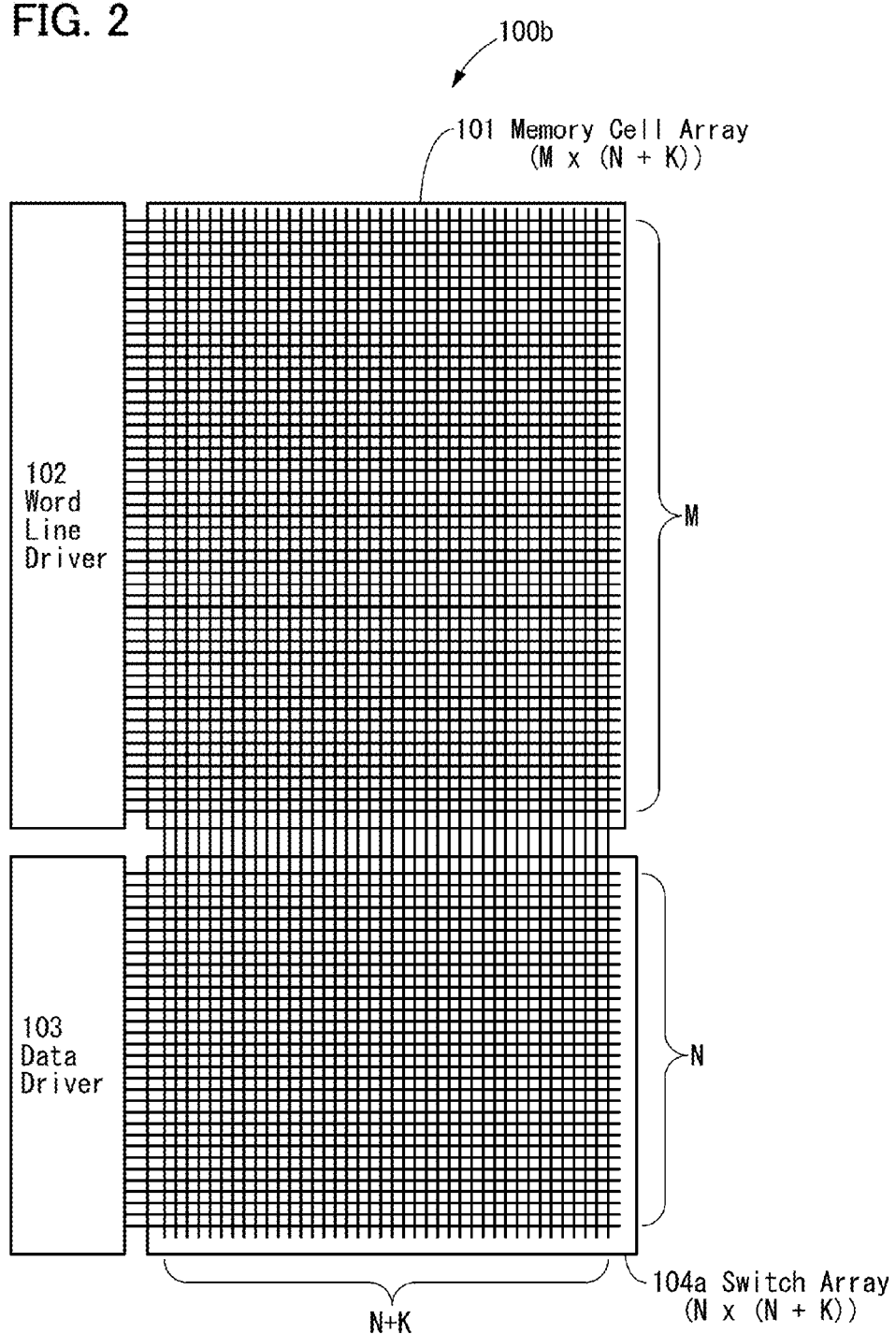
FIG. 2 illustrates a structural example of a data processing device.

Hereinafter, embodiments will be described in detail with reference to the accompanying drawings. Note that the present invention is not limited to the description below, and it is easily understood by those skilled in the art that a variety of modifications can be made to the modes and details without departing from the spirit and scope of the present invention. Therefore, the present invention should not be construed as being limited to the following description of the embodiments. Embodiments described below can be implemented in combination with any of the other embodiments as appropriate.

Note that in the following embodiments, the same portions or portions having similar functions are denoted by the same reference numerals in different drawings, and explanation thereof will not be repeated. "High" and "low" of signals can be reversed depending on the circuit configuration.

In the following embodiments, the term "matrix" may be expressed as an array of rows and columns intersecting at right angles; however, it may practically be an array of rows and columns intersecting at angles that are not right angles.

Embodiment 1

FIG. 1A illustrates a structural example and an operation example of a data processing device 100a. The data processing device 100a includes a memory cell array 101 in which memory cells MC are arranged in a matrix. Here, the memory cell array 101 includes 16 rows and 10 columns; however, the scale of the memory cell array 101 is not limited thereto.

One of word lines WL[1] to WL[16] and one of bit lines BL[1] to BL[10] are connected to every memory cell MC. For example, the memory cell at an intersection of the word line WL[1] and the bit line BL[10] is expressed as MC[1, 10] in FIG. 1A. Note that "the intersection" herein is the term in a circuit concept and does not strictly limit the spatial position. Accordingly, the actual position of the memory cell MC[1, 10] is not limited to the area where the word line WL[1] intersects with the bit line BL[10] and may be positioned apart from the word line WL[1] or the bit line BL[10].

Although one bit line BL is connected to one memory cell MC in FIG. 1A, one embodiment of the present invention is not limited to this structure. A plurality of bit lines may be connected to one memory cell MC as in a general SRAM. A structure in which different word lines or bit lines are used for writing and reading may be employed.

The data processing device 100a includes a word line driver 102 for driving the word lines WL[1] to WL[16] and a data driver 103 for transmitting data to the bit lines BL. Note that the word line driver 102 and the data driver 103 may be formed of single-purpose circuits or may be formed of configurable or reconfigurable circuits. Data is output to data lines DL[1] to DL[8] from the data driver 103, and data from the memory cell array is input to the data driver 103 through the data lines DL[1] to DL[8]. The data lines DL[1] to DL[8] intersect with the bit lines BL[1] to BL[10], forming a matrix of 8 rows and 10 columns.

At the intersections of the data lines DL and the bit lines BL, programmable switches PS are provided. For example, in FIG. 1A, the programmable switch at the intersection of the data line DL[1] and the bit line BL[10] is expressed as PS[1, 10]. The programmable switches PS constitute a switch array 104a that is a matrix of 8 rows and 10 columns.

The programmable switches PS determine conduction or insulation between the data lines DL and the bit lines BL. For example, the programmable switch PS[1, 2] determines conduction or insulation between the data line DL[1] and the bit line BL[2].

For example, the programmable switch PS may have a structure illustrated in FIG. 1B in which a switch 106 for connecting the data line DL[1] and the bit line BL[2] is controlled by a memory cell 105. Alternatively, as illustrated in FIG. 1C, the programmable switch PS may have a structure including a fuse 107 (or an anti-fuse) for connecting the data line DL[1] and the bit line BL[2]. In other words, the programmable switch PS may be either a one-time programmable switch or a reprogrammable switch.

Since the word line driver 102 has 16 output terminals and the data driver 103 has 8 output terminals, the memory capacity of the data processing device 100a is 16×8 bits. In contrast, the memory cell array 101 is organized in a 16×10-bit matrix. This means that two of the bit lines BL[1] to BL[10] are spare bit lines (redundant bit lines). In the data processing device 100a, a bit line on which a defective memory cell lies of the bit lines BL[1] to BL[10] can be replaced with either of the spare bit lines.

For example, when the memory cell MC[8, 5] and the memory cell MC[11, 4] are defective memory cells as illustrated in FIG. 1A, an operation for not writing data to the bit lines BL[4] and BL[5] is performed; in the data processing device 100a, control is performed so that the bit lines BL[4] and BL[5] are not connected to the data lines DL[1] to DL[8] in the switch array 104a.

For example, as illustrated in FIG. 1A, the programmable switch PS[1, 1], the programmable switch PS[2, 2], the programmable switch PS[3, 3], the programmable switch PS[4, 6], the programmable switch PS[5, 7], the programmable switch PS[6, 8], the programmable switch PS[7, 9], and the programmable switch PS[8, 10] are switched on and the other the programmable switches PS are switched off. As a result, the bit lines BL[4] and BL[5] are not connected to the data lines DL[1] to DL[8].

The structure illustrated in FIG. 1A is only an example. The same effect can be obtained when the programmable switch PS[1, 10], the programmable switch PS[2, 9], the programmable switch PS[3, 8], the programmable switch PS[4, 7], the programmable switch PS[5, 6], the programmable switch PS[6, 3], the programmable switch PS[7, 2], and the programmable switch PS[8, 1] are switched on and the other programmable switches PS are switched off.

In other words, any conduction state of the programmable switches PS may be employed as long as the bit lines BL except the bit lines BL[4] and BL[5] and the data lines DL[1] to DL[8] are connected in one-to-one correspondence. There are approximately 40,000 possible combinations.

In the above-described example, defective memory cells lie on two bit lines BL. Similarly, in the case where a defective memory cell lies on only one bit line BL, any conduction state of the programmable switches PS may be employed as long as arbitrary eight bit lines BL except the bit line BL on which the defective memory cell lies and the data lines DL[1] to DL[8] are connected in one-to-one correspondence.

Such a great number of programming combinations in the switch array 104a means high redundancy because in the case where a programmable switch PS is defective, the same function can be provided even by using a different programmable switch PS. However, redundancy exceeding the necessary level might be accomplished in some cases, which is described later.

The data processing device 100a cannot be saved when including defective memory cells on more than two bit lines. To save the data processing device including defective memory cells on three bit lines, the number of bit lines needs to be 11 (3 of them are spare bit lines). However, consideration of the probability of defective memory cells on more than two bit lines might be unnecessary for the reason described below. Next, the relation between the total number of bit lines and the probability of saving the data processing device is considered.

In the following example, in order to distinctly show the difference in small-scale matrixes, the probability of defective memory cells is assumed relatively high although it can be practically lower than the assumed value. Here, the probability that there is no defective memory cell on one bit line (16 memory cells are all normal) is assumed 90%. That is, the probability that at least one of the 16 memory cells is defective is 10%.

In the case where the number of bit lines is eight (no spare bit line), the probability that the data processing device 100a is a non-defective item (there is no defective memory cell in each of the eight bit lines BL) is approximately 43%. That is, more than half the produced items are defective items.

In the case where the number of bit lines is nine (one spare bit line), the probability that there is no defective memory cell in each of the nine bit lines is approximately 39% and the probability that there is a defective memory cell in only one of the bit lines is approximately 39%. In the case where there is a defective memory cell in only one of the bit lines, the data processing device can be saved with the spare bit line; consequently, the rate of non-defective items is increased to approximately 77%.

In the case where the number of bit lines is 10 (two spare bit lines), the probability that there is no defective memory cell in each of the 10 bit lines is approximately 35%, the probability that there is a defective memory cell in only one of the bit lines is approximately 39%, and the probability that there is a defective memory cell in any two of the bit lines is approximately 19%. In the case where there is a defective memory cell in only one of the bit lines or any two of the bit lines, the data processing device can be saved with the spare bit lines; consequently, the rate of non-defective items is increased to approximately 93%.

In the case where the number of bit lines is 11 (three spare bit lines), the probability that there is no defective memory cell in each of the 11 bit lines BL is approximately 31%, the probability that there is a defective memory cell in only one of the bit lines is approximately 38%, the probability that there is a defective memory cell in any two of the bit lines is approximately 21%, and the probability that there is a defective memory cell in any three of the bit lines is approximately 7%. In the case where there is a defective memory cell in any one, two, or three of the bit lines, the data processing device can be saved with the spare bit lines; consequently, the rate of non-defective items is increased to approximately 98%.

In the case where the number of bit lines is 12 (four spare bit lines), the probability that there is no defective memory cell in each of the 12 bit lines BL is approximately 28%, the probability that there is a defective memory cell in only one of the bit lines is approximately 38%, the probability that there is a defective memory cell in any two of the bit lines is approximately 23%, the probability that there is a defective memory cell in any three of the bit lines is approximately 9%, and the probability that there is a defective memory cell in any four of the bit lines is approximately 2%. In the case where there is a defective memory cell in any one, two, three, or four of the bit lines, the data processing device can be saved with the spare bit lines; consequently, the rate of non-defective items is increased to approximately 100%.

Although a larger number of spare bit lines causes a higher rate of non-defective items as described above, it also causes an increase in the circuit area of the memory cell array and the switch array in which the spare bit lines are provided. For example, in the case where the number of bit lines is nine, the circuit area of the memory cell array and the switch array is 1.125 times as large as that in the case where the number of bit lines is eight; however, the yield is 1.8 times as high as that in the case where the number of bit lines is eight. The circuit area divided by the yield in the case where the number of bit lines is nine is 1.6 times as high as that in the case where the number of bit lines is eight (the case without a spare bit line). This value is referred to as area performance.

The area performances calculated similarly for the cases of 10 bit lines, 11 bit lines, and 12 bit lines are 1.73 times, 1.66 times, and 1.54 times, respectively. As is understood from these values, by increasing the number of bit lines at random, nothing but the circuit area is increased and an improvement in yield cannot be expected. The above calculation shows that the area performance and the efficiency are the highest in the case where the number of bit lines is 10.

Although the results will vary from the above-described results depending on the probability of a defective memory cell in one bit line and the number of data lines, the optimum number of bit lines can be calculated in the same manner.

The memory cell array 101 in FIG. 1A including 16 rows and 10 columns has been described. Here, a structural example of a data processing device 100b with a memory capacity of M×N bits and K spare bit lines is illustrated in FIG. 2. In the data processing device 100b, the memory cell array 101 includes M rows and (N+K) columns and the switch array 104a includes N rows and (N+K) columns.

In general, the memory cell array 101 including bit lines more than word lines is not practical because the matrix of the switch array 104a becomes larger than the matrix of the memory cell array 101. In this case, defects in the programmable switches PS in the switch array 104a needs to be considered. In contrast, when the number of bit lines is smaller than the number of word lines, the switch array 104a with a relatively small size can efficiently exclude the bit line on which a defective memory cell lies.

The scale of the switch array 104a is determined by the number of data lines and the number of spare bit lines; accordingly, the scale of the switch array 104a can be reduced by decreasing the number of these lines. To decrease the number of data lines while maintaining the memory capacity, the number of word lines needs to be increased; in this case, the number of memory cells included in one bit line is increased, which also increases the probability of a defective memory cell in one bit line.

In general, as the probability of a defective memory cell in one bit line increases, more spare bit lines are necessary. Therefore, decreasing the number of data lines may cause an increase in the scale of the memory cell array 101 or the switch array 104a.

Figure 3:
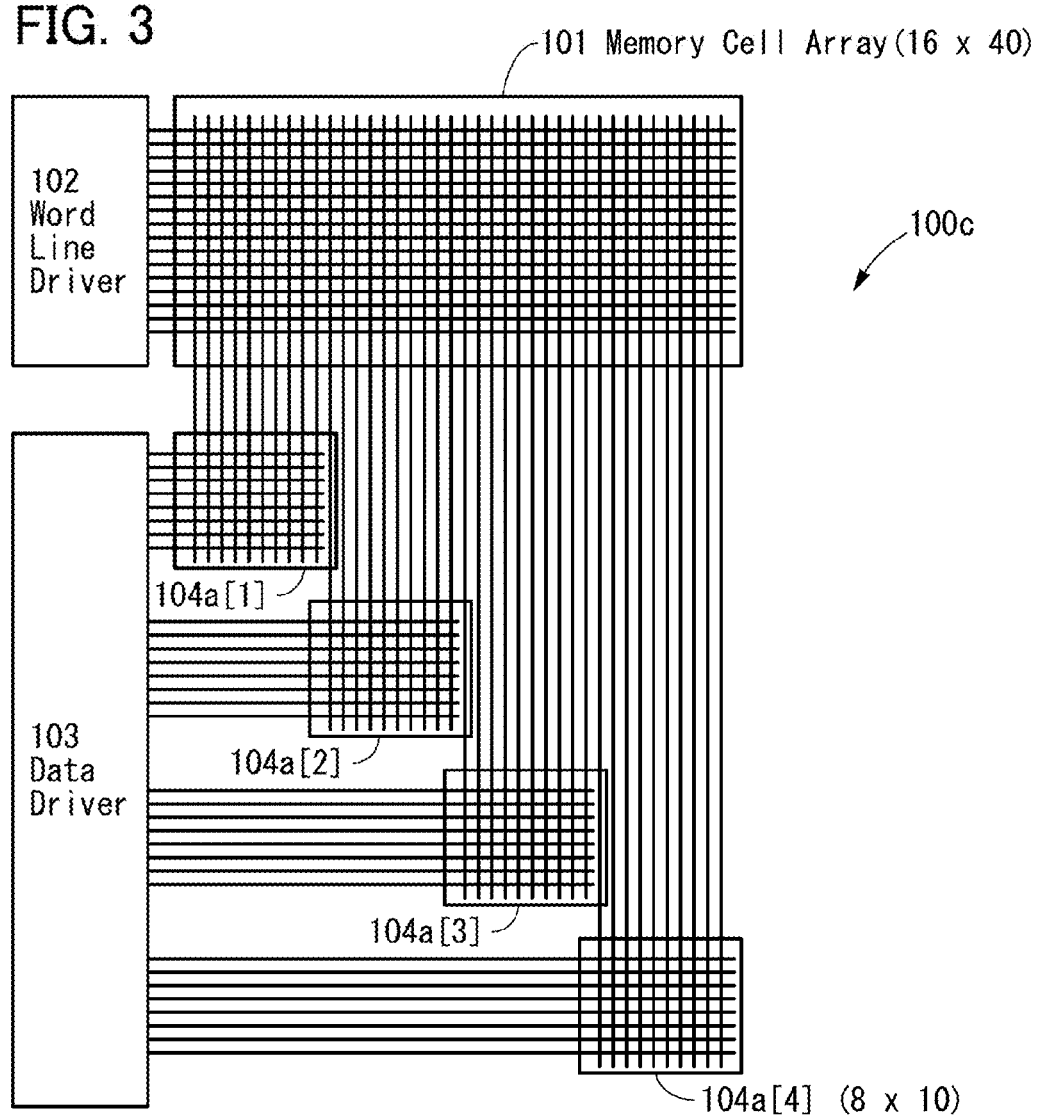
FIG. 3 illustrates a structural example of a data processing device.

FIG. 3 illustrates an example of a data processing device 100c including the memory cell array 101 (16 rows and 40 columns) with a larger scale than that illustrated in FIG. 1A. Since there are 32 data lines in the data processing device 100c, the memory capacity is 512 bits, which is four times as large as that of the data processing device 100a illustrated in FIG. 1A. When formed of data lines and bit lines in a manner similar to that of FIG. 1A, the switch array 104a needs to include 32 rows and 40 columns, which is 16 times the scale of the switch array 104a of FIG. 1A.

However, in the data processing device 100c, the bit lines and the data lines are each divided into four groups to form switch arrays 104a[1] to 104a[4] each formed of 8 rows of data lines and 10 columns of bit lines. By this method, a smaller scale is possible although the yield is reduced.

If a defective memory cell is generated at the probability mentioned above regarding FIG. 1A, the switch array 104a including 8 rows and 10 columns has a yield of 93%. Accordingly, by combining four switch arrays 104a each including 8 rows and 10 columns, the yield of the data processing device 100c becomes 75%.

Meanwhile in the switch array 104a including 32 rows and 40 columns, there are 8 spare bit lines, and the data processing device can be saved in the case where less than or equal to 8 bit lines out of the 40 bit lines have a defective memory cell. In this case, the yield is 96%.

In the above description, the possibility of excessive redundancy due to a great number of combinations for excluding a specific bit line has been mentioned. For example, in the data processing device 100a in FIG. 1A, 10 bit lines intersect with one data line, and a programmable switch PS is provided at each intersection. However, because the number of spare bit lines is two, not all the programmable switches are always necessary. Even if four or more bit lines intersect with one data line and a programmable switch PS is provided at each intersection, at least one of them cannot contribute to the connection of the spare bit lines. In other words, it should be sufficient that programmable switches PS are arranged so that three bit lines can be connected to one data line.

Figure 4:
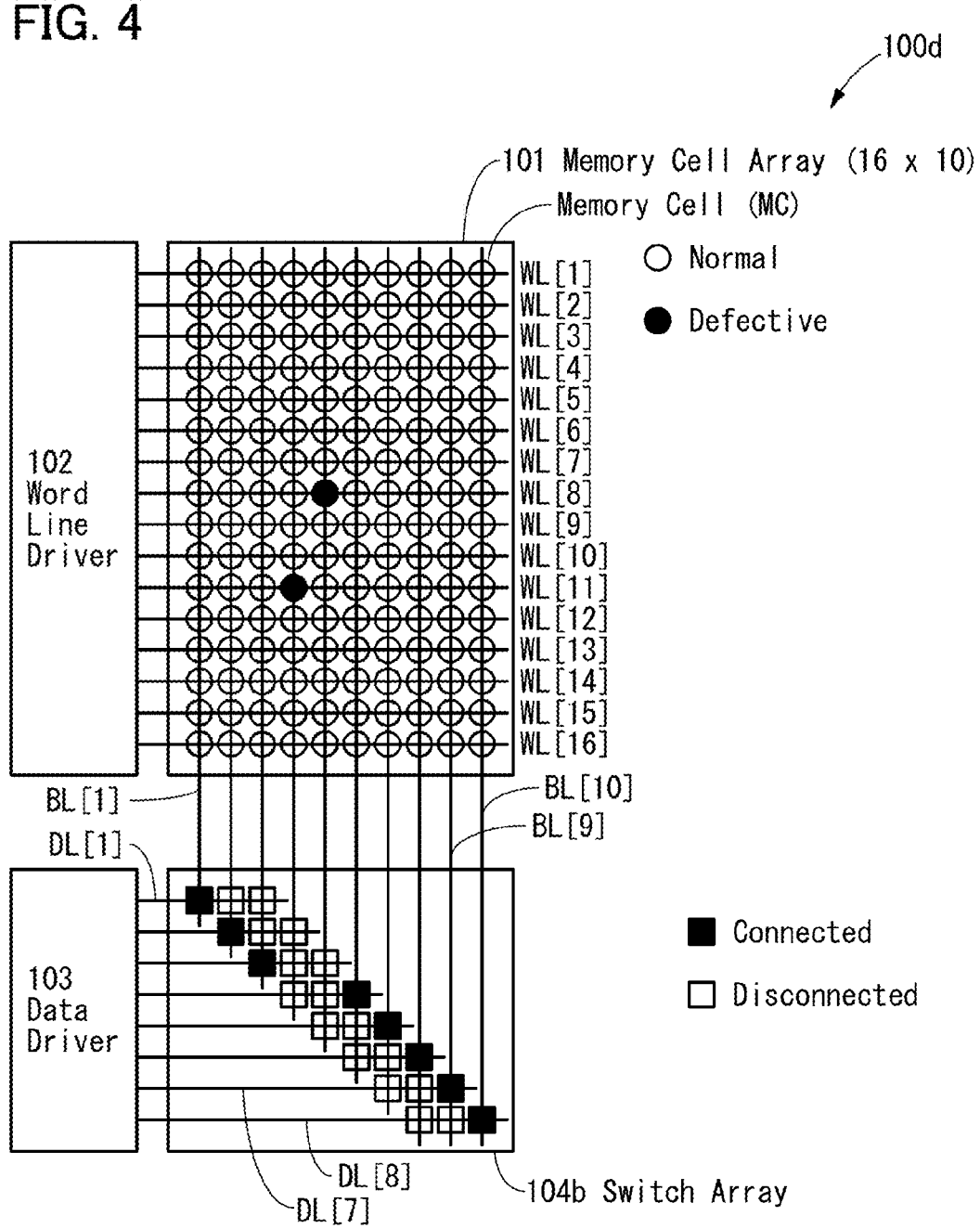
FIG. 4 illustrates a structural example and an operation example of a data processing device.

A data processing device 100d including a switch array 104b in which the number of programmable switches PS is reduced to a minimum with the above-described idea is illustrated in FIG. 4. In the switch array 104b, programmable switches PS are arranged so that only three bit lines can be connected to each data line. Although the programmable switches PS are arranged so that three adjacent bit lines can be connected to one data line in the drawing, the programmable switches PS may be arranged so that three bit lines existing apart from one another can be connected to one data line, for example, the bit lines BL[2], BL[3], and BL[8] can be connected to the data line DL[1].

By minimizing the intersections between bit lines and data lines as illustrated in FIG. 4, signal delay and power consumption can be reduced. For this reason, it is preferable to arrange programmable switches PS so that three adjacent bit lines can be connected to one data line.

Figure 5A:
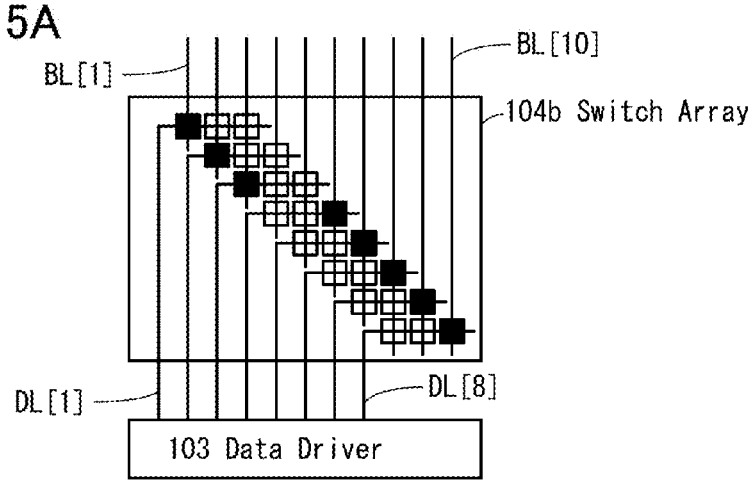
FIGS. 5A to 5C illustrate structural examples of a data processing device.
Figure 5B:
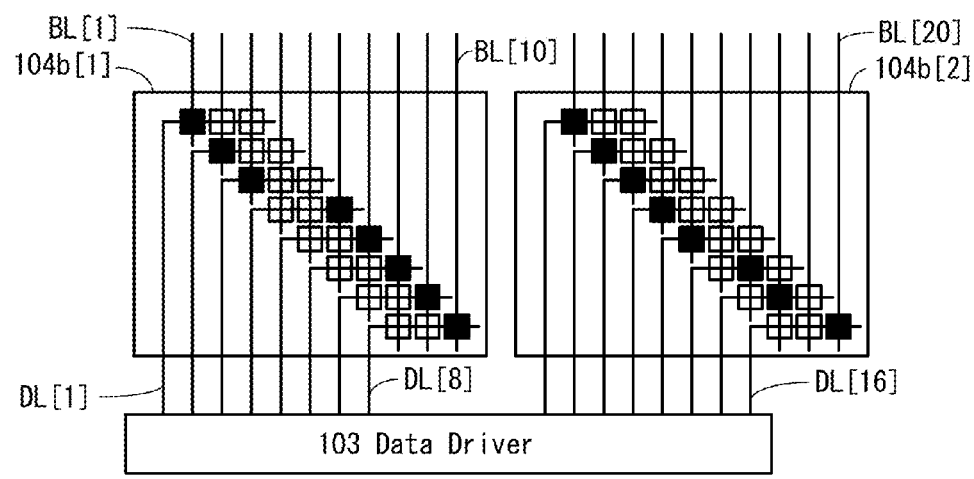
Figure 5C:
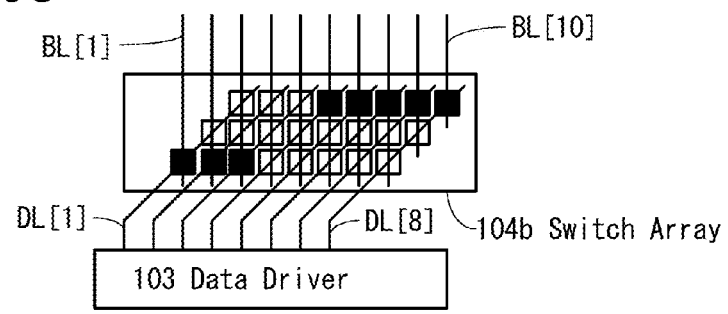

As illustrated in FIG. 5A, the data lines may be bent in an area where the switch array 104b is formed. To increase the number of data lines as in the case of FIG. 3, a switch array 104b[1] and a switch array 104b[2] may be used as illustrated in FIG. 5B. Furthermore, to reduce the area occupied by the switch array 104b, the data lines DL may be arranged oblique to the bit lines BL as illustrated in FIG. 5C.

The structure of the switch array 104b illustrated in FIG. 4 is the only structure that allows the bit lines BL[4] and BL[5] not to be connected to the data lines DL[1] to DL[8]. When programmable switches are arranged so that other arbitrary two bit lines are not connected to the data lines DL[1] to DL[8], there is only one possible structure. In other words, the switch array 104b is the least redundant switch array.

The probability that any of the 24 programmable switches PS is defective (in the following description, the defect probability of causing a normally connected programmable switch PS is assumed to be 0 and only the defect which is a normally disconnected programmable switch PS is considered) is 15%, on the assumption that the probability that any of the 16 memory cells is defective is 10% as in the description with reference to FIG. 1A.

Note that actually 8 out of the 24 programmable switches PS need to be in a connected state. Therefore, even if damage is caused in the other 16 programmable switches PS, actual damage is not caused. If one of the 8 programmable switches PS that need to be in a connected state is defective, the data processing device 100d might not be able to function normally. The probability that a defective programmable switch PS is one of the 8 programmable switches can be estimated at approximately 5%.

As described with reference to FIG. 1A, even if defective memory cells are included in the memory cell array 101, the yield can become 93% by providing two spare bit lines. However, in the data processing device 100d, the yield is decreased to 88% (93%×95%) owing to the above-described defect of the programmable switches PS.

To improve yield, redundancy may be increased by increasing the number of programmable switches PS like in a switch array 104c of a data processing device 100e illustrated in FIG. 6, for example. In the switch array 104c illustrated in FIG. 6, in the case where the programmable switch PS[8, 10] is defective, the programmable switch PS[7, 10] can be brought into a connected state. Here, since the data line DL[7] is connected to the bit line BL[10], the data line DL[8] needs to be connected to another bit line. In the example illustrated in FIG. 6, the programmable switch PS[8, 9] is brought into a connected state. Thus, yield can be improved.

Alternatively, the programmable switch PS[6, 9] may be brought into a connected state; in this case, the programmable switch PS[6, 8] is brought into an insulated state and the programmable switch PS[5, 8] or the programmable switch PS[8, 8] is brought into a connected state. Note that when the programmable switch PS[5, 8] is brought into a connected state, the states of other programmable switches need to be changed.

In the above-described example, in order to distinctly show the difference in the small-scale matrix, the probability of defective memory cells is assumed relatively high although it can be practically lower than the assumed value. In accordance with this probability, the number of spare bit lines and the scale and structure of the switch array are optimized. In the above description, the bit lines and the word lines may be interchanged.

Embodiment 2

Structures that prevent data transmission to the bit line which a defective memory cell is connected to have been described in Embodiment 1. In this embodiment, a data processing device further including a test circuit for detecting a defective memory cell will be described.

A data processing device 100f illustrated in FIG. 7 and FIG. 8 includes the memory cell array 101, the data driver 103, a switch array 104d, and a test circuit 108a. As described in Embodiment 1, the switch array 104d has a function of connecting the bit lines BL[1] to BL[10] to the data lines DL[1] to DL[8] in one-to-one correspondence. In addition, the switch array 104*d* has a function of connecting the bit lines BL[1] to BL[10] to the test circuit 108*a*. Note that reprogrammable switches can be employed in the switch array 104*d*.

The test circuit 108*a* includes terminals TLa[1] to TLa[10] and terminals TLb[1] to TLb[10]. These terminals are connected to wirings that are different from the data lines DL[1] to DL[8]. By the switch array 104*d*, the terminals TLa[1] to TLa[10] and the terminals TLb[1] to TLb[10] are connected to the bit lines BL[1] to BL[10].

With this structure, a test signal generated by the test circuit 108*a* is supplied to the memory cell array 101 and the test circuit 108*a* receives an output signal from the memory cell array 101; in this way, operation of each memory cell in the memory cell array 101 can be judged and a defective memory cell can be detected.

FIG. 7 illustrates the switch array 104*d* during the test. In other words, the bit lines BL[1] to BL[10] are connected to the terminals TLa[1] to TLa[10] and the terminals TLb[1] to TLb[10] by 20 programmable switches PS. Here, a signal from the memory cell array 101 is input to the terminals TLa[1] to TLa[10] and a test signal is output from the terminals TLb[1] to TLb[10]. Of course, the relation may be opposite, that is, a signal from the memory cell array 101 may be input to the terminals TLb[1] to TLb[10] and a test signal may be output from the terminals TLa[1] to TLa[10]. Note that the terminal TLa[n] and the terminal TLb[n] (n is an integer of 1 to 10) are connected to one same bit line.

In FIG. 7, an example in which the terminal TLa[n] and the terminal TLb[n] are connected to the bit line BL[n] is illustrated; however, one embodiment of the present invention is not limited to this example. To connect the terminals TLa[1] to TLa[10] (and the terminals TLb[1] to TLb[10]) to the bit lines BL[1] to BL[10] in one-to-one correspondence, there are approximately 3.6 million possible combinations. Although not all of these combinations need to be tested, it is preferable to test some of the combinations on the assumption that some of the programmable switches PS would be defective. Note that this method cannot be used in a data processing device 100*g* described later with reference to FIG. 9.

The test signal is transmitted from the terminals TLb[1] to TLb[10] through the programmable switches PS and the bit lines BL[1] to BL[10] to the memory cell array 101.

Any of a variety of test signals can be used for the test signal. For example, all the data is "0", all the data is "1", data alternates between "0" and "1" every column, data alternates between "0" and "1" every other column, data alternates between "0" and "1" every row, data alternates between "0" and "1" every other row, or data forms a checkered pattern. A signal for selecting a word line is generated by the word line driver, and the test signal transmitted from the test circuit is written to the corresponding memory cell. Although the word line driver and the word lines are not illustrated in FIG. 7, FIG. 1A and the like can be referred to for them.

After test data is written to the memory cell of the memory cell array 101, a signal for selecting a word line is generated by the word line driver and data is read from the corresponding memory cell. The data is input to the test circuit 108*a* through the bit line BL and the programmable switch PS, and the read data and the data that would have been written (expected value) are compared with each other. When the data is different, the memory cell is judged a defective memory cell.

When it is judged that defective memory cells lie on the bit lines BL[4] and BL[5] for example, the switch array 104*d* is set so that the data lines DL[1] to DL[8] are not connected to the bit lines BL[4] and BL[5] as described in Embodiment 1. A setting example is illustrated in FIG. 8. The data processing device 100*f* is used in this state.

The connection between the bit lines BL[1] to BL[10] and the data lines DL[1] to DL[8] described in Embodiment 1 applies here, and Embodiment 1 can be referred to for the details.

The data processing device 100*f* that includes the test circuit can shorten the test time at the product shipment. Moreover, the memory cell array 101 can be tested as necessary even after the product shipment, so that when a memory cell deteriorates to become defective owing to long-term use, the memory cell can be replaced with a normal memory cell.

For the same reason described in Embodiment 1, the switch array 104*d* has excessive redundancy. In the same way as that of the data processing device 100*d* (FIG. 4), unnecessary programmable switches PS may be removed from the switch array 104*d*. Regarding the data processing device 100*f*, if the connection method between the terminals TLa[1] to TLa[10] and TLb[1] to TLb[10] of the test circuit 108*a* and the bit lines BL[1] to BL[10] is limited to the method illustrated in FIG. 7, programmable switches PS that are not involved in the connection are unnecessary. The data processing device 100*g* including a switch array 104*e* with such unnecessary programmable switches PS removed is illustrated in FIG. 9.

In a manner similar to that of the data processing device 100*d*, the data processing device 100*g* has significantly low redundancy; accordingly, the data processing device 100*g* might not be able to be saved when a programmable switch PS in the switch array 104*e* is defective.

In the data processing device 100*f*, since the switch array 104*d* is provided with not only the data lines DL but also the wirings connected to the terminals TLa[1] to TLa[10] and the terminals TLb[1] to TLb[10], the capacity of the bit lines BL[1] to BL[10] is increased, causing signal delay.

Against this problem, a structure like a data processing device 100*h* illustrated in FIG. 10 may be employed in which data lines DL are gathered on the near side of the memory cell array 101, wirings connected to the test circuit 108*a* are gathered on the far side of the memory cell array 101, and a switch group 109 is provided therebetween. During the test, the switch group 109 may be turned on to connect the test circuit 108*a* to the memory cell array 101; during normal use, the switch group 109 may be turned off to disconnect the memory cell array 101 from the bit lines located on the far side than the switch group 109. FIG. 10 illustrates the state during normal operation. By reducing the capacity of the bit lines in this manner, power consumption during normal operation can be reduced and writing and reading speed can be improved.

As switches used in the switch group 109, not only reprogrammable switches but also one-time programmable switches such as anti-fuse switches may be used. Note that in this case, tests after the product shipment cannot be done.

Furthermore, when the test circuit 108*a* is arranged on the same side as the data driver 103 as illustrated in FIG. 10, large space can be left on the right side of a switch array 104*f* on the drawing. The space can be utilized for other circuits (e.g., another switch array). For example, an equivalent data processing device having an arrangement that is bilaterally symmetrical to the data processing device 100*h* may be provided on the right side of the data processing device 100*h*.

In a data processing device 100*i* illustrated in FIGS. 11A and 11B, the terminals TLa[1] to TLa[8] of a test circuit 108*b* are connected to the data lines DL[1] to DL[8]. Thus, the scale of a switch array 104*g* can be reduced. FIG. 11A illustrates the data processing device 100*i* during the test, and FIG. 11B illustrates the data processing device 100*i* during normal operation.

In data reading from memory cells MC, for example, data read through a first programmable switch PS, data read through a second programmable switch PS, and data read through a third programmable switch PS are compared, so that the functions of these three programmable switches PS can be analyzed. In the case where the data through one of the programmable switches PS is different from the data through the other two programmable switches PS, the one programmable switch PS is judged to be defective. When the defective programmable switch PS is found, the connection between the data lines DL and the bit lines BL can be set in normal operation to avoid the defective programmable switch PS.

Settings that can prevent the data driver 103 and the test circuit 108b from hindering the operation in the test or normal operation are necessary. For example, it is preferable that the data driver 103 is insulated from the data lines DL during the test and that the test circuit 108b is insulated from the data lines DL during normal operation.

Figure 12A:
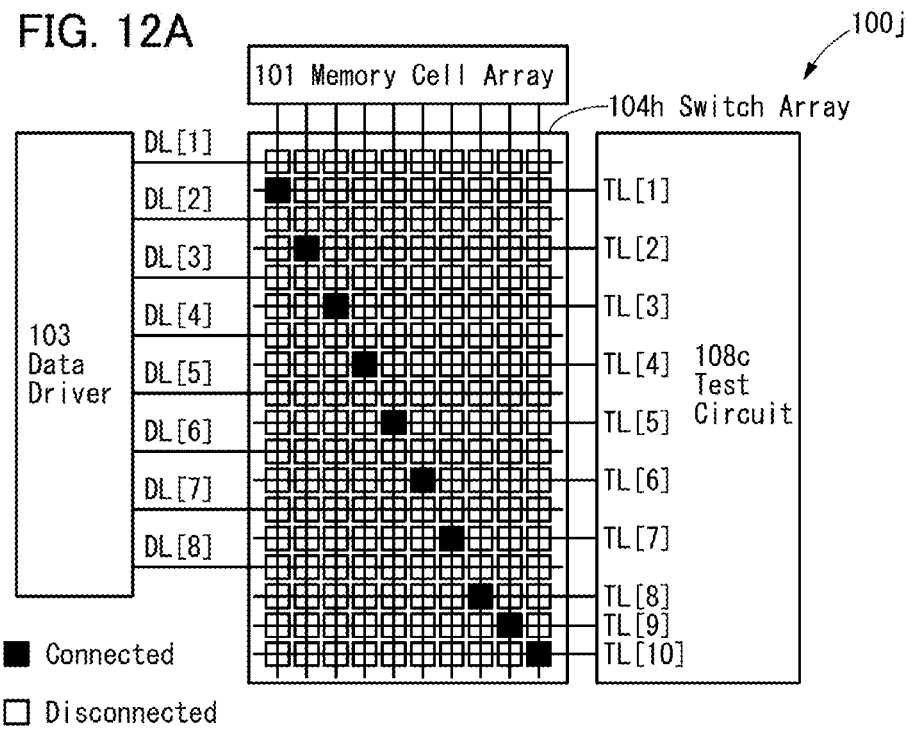
FIGS. 12A and 12B illustrate a structural example and an operation example of a data processing device.
Figure 12B:
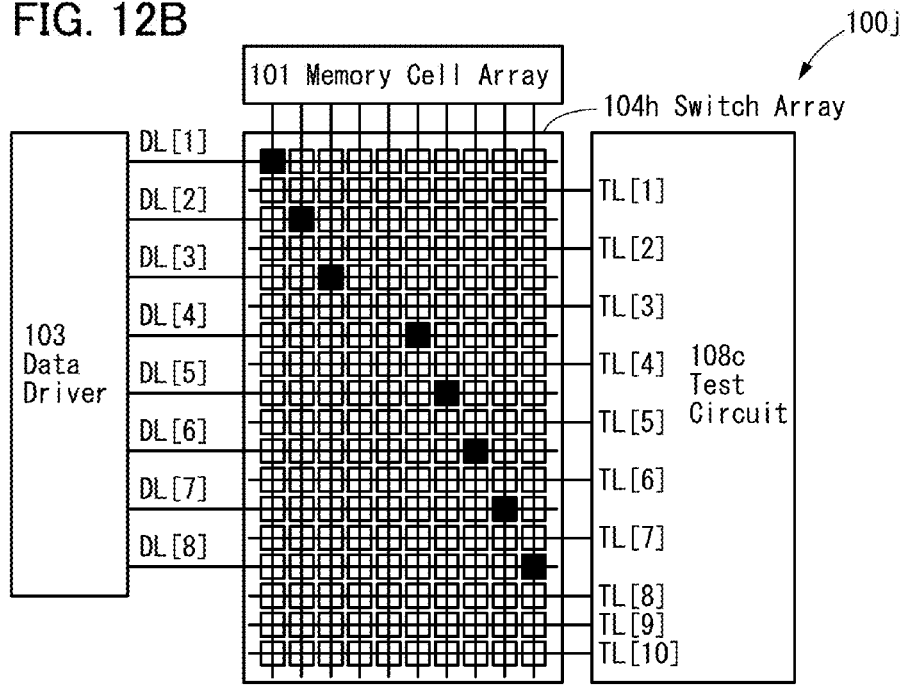

A data processing device 100j illustrated in FIGS. 12A and 12B includes a switch array 104h and a test circuit 108c in which one terminal TL is in charge of both transmission of a test signal and reception of a data signal. FIG. 12A illustrates the data processing device 100j during the test, and FIG. 12B illustrates the data processing device 100j during normal operation.

A data processing device 100k illustrated in FIGS. 13A and 13B includes a test circuit 108d having the same structure as the test circuit 108c illustrated in FIG. 12A, where the terminals TL[1] to TL[8] of the test circuit 108d are connected to the data lines DL[1] to DL[8]. In this way, the scale of a switch array 104i can be reduced to an array of 10 rows and 10 columns. In a manner similar to that of the data processing device 100i, the programmable switches PS can be tested during the test, and settings can be changed so that a defective programmable switch PS is not used in the period other than the test period. FIG. 13A illustrates the data processing device 100k during the test, and FIG. 13B illustrates the data processing device 100k during normal operation.

Settings that can prevent the data driver 103 and the test circuit 108d from hindering the operation in the test or normal operation are necessary. For example, it is preferable that the data driver 103 is insulated from the data lines DL during the test and that the test circuit 108d is insulated from the data lines DL during normal operation.

A data processing device 100l illustrated in FIGS. 14A and 14B includes the test circuit 108d having the same structure as the test circuit 108c illustrated in FIG. 12A, where the terminals of the test circuit 108d are connected to the bit lines BL[1] to BL[10]. In this way, the scale of a switch array 104j can be reduced to an array of 8 rows and 10 columns.

FIG. 14A illustrates the data processing device 100l during the test, and FIG. 14B illustrates the data processing device 100l during normal operation. During the test, the test circuit 108d can access the memory cells, not via the programmable switches PS.

Power is supplied to the test circuits 108a to 108d only during the test, and power supply to a part or the whole of the test circuits is stopped during the other period, whereby power consumption can be reduced.

Embodiment 3

Although the examples in which spare bit lines (or spare word lines) are provided to exclude defective memory cells are described in Embodiment 1, both spare bit lines and spare word lines may be provided. A data processing device 100m illustrated in FIG. 15 has a memory capacity of 128 bits and includes the memory cell array 101 of 18 rows and 10 columns, that is, includes two spare bit lines and two spare word lines.

The data processing device 100m includes a switch array 104k as well as the switch array 104a for connecting the bit lines to the data lines (the matrix scale is 8 rows and 10 columns). The inside of the switch array 104k is divided into upper and lower regions, one of which is connected to a decoder 110[1] and the other of which is connected to a decoder 110[2].

Programmable switches PS are arranged in the switch array 104k so that the word lines WL[1] to WL[6] can be connected to only the decoder 110[1], the word lines WL[13] to WL[18] can be connected to only the decoder 110[2], and the word lines WL[7] to WL[12] can be connected to both the decoder 110[1] and the decoder 110[2].

Figure 15:
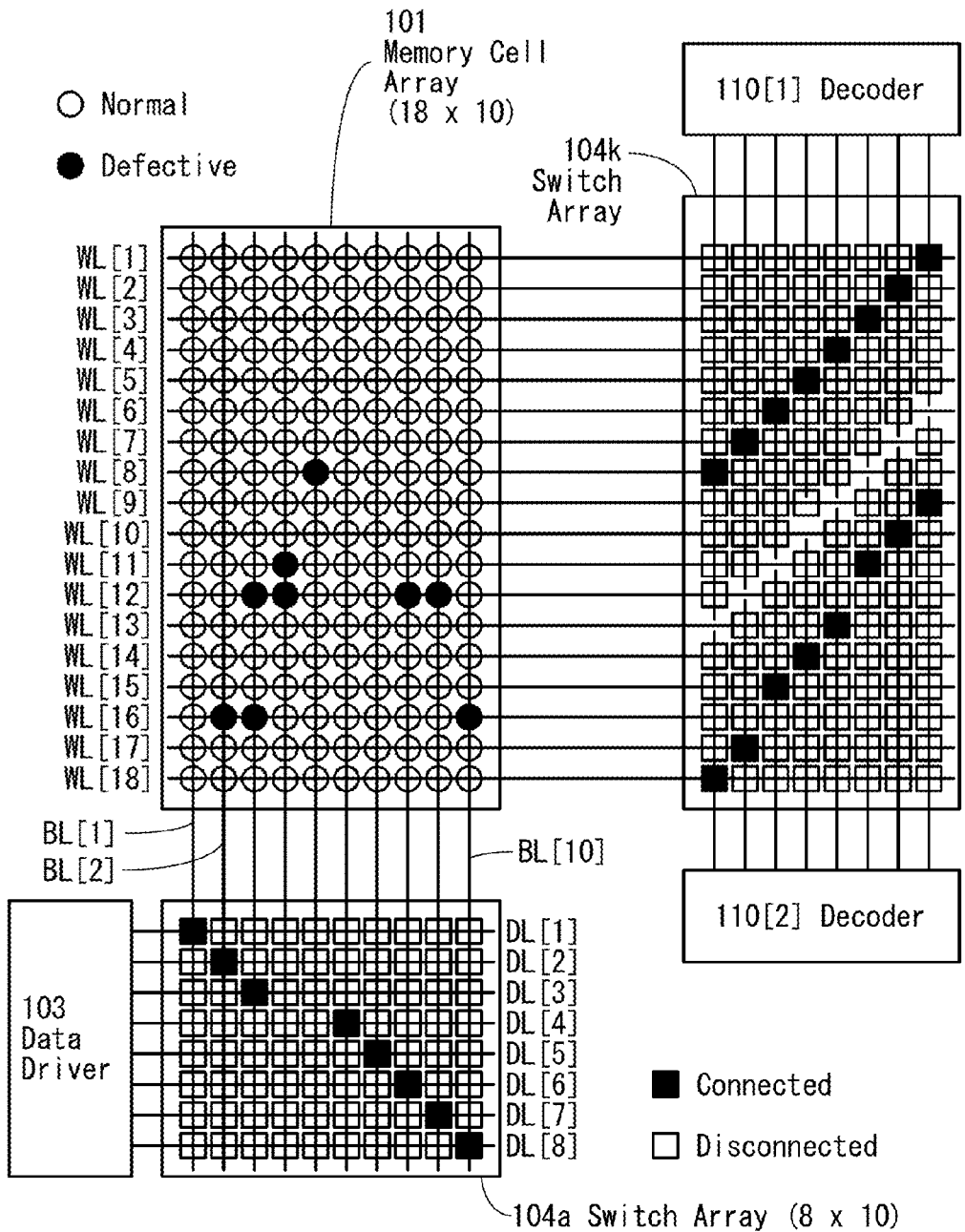
FIG. 15 illustrates a structural example and an operation example of a data processing device.

By this arrangement, even when word lines that should be excluded are locally generated in one part of the memory cell array for example, the data processing device can be saved. In FIG. 15, the memory cells MC[8, 5], MC[11, 4], MC[12, 3], MC[12, 4], MC[12, 8], MC[12, 9], MC[16, 2], MC[16, 3], and MC[16, 10] are defective. Since the defective memory cells exist locally particularly on the word line WL[12] and the word line WL[16], the switch array 104k is set so that these word lines are not connected to the decoders 110.

The memory cells MC[8, 5] and MC[11, 4] are defective memory cells that are not connected to the word lines WL[12] and WL[16], and the switch array 104a is set so that the corresponding bit lines BL[4] and BL[5] are not connected to the data driver 103. Embodiment 1 can be referred to for the details.

The switch array 104k can have excessive redundancy, and programmable switches can be decreased. FIG. 16 illustrates a data processing device 100n including a switch array 104l in which programmable switches are decreased.

In the data processing device 100n, the word lines WL[1] to WL[8] can be connected to only the decoder 110[1], the word lines WL[11] to WL[18] can be connected to only the decoder 110[2], and the word lines WL[9] and WL[10] can be connected to both the decoder 110[1] and the decoder 110[2].

The word lines WL[1] and WL[18] are each connected to the decoder 110 with one programmable switch PS. The word lines WL[2] and WL[17] are each connected to the decoder 110 with two programmable switches PS. The other word lines WL are each connected to the decoder(s) 110 with three programmable switches PS. The switch array 104l has minimum redundancy, and programmable switches PS may be added thereto as necessary to secure redundancy.

The same structure as that of the switch array 104l may be employed in the switch array that selects redundant bit lines.

Embodiment 4

As the test circuits 108a to 108d described in Embodiment 2, single-purpose circuits (fixed circuit) may be used or configurable circuits may be used with the settings adjusted. As the configurable circuits, reprogrammable circuits (reconfigurable circuits) may be used. Alternatively, a structure in which a signal is transmitted from a reconfigurable circuit to the test circuits 108a to 108d may be employed.

An example of forming the test circuit 108a using a reconfigurable circuit (e.g., an FPGA) will be described with reference to FIG. 17. FIG. 17 illustrates a device which includes a reconfigurable block 111[1] including programmable logic circuits PLC[1, 1] to PLC[1, 16], a reconfigurable block 111[2] including programmable logic circuits PLC[2, 1] to PLC[2, 16], and an inter-connect matrix 112 between the reconfigurable block 111 [1] and the reconfigurable block 111 [2]. Note that the programmable logic circuits PLC may be each formed of one or more programmable logic elements.

The programmable logic circuits PLC[1, 3] to PLC[1, 12] and the programmable logic circuits PLC[2, 3] to PLC[2, 12] out of those programmable logic circuits PLC constitute the test circuit 108a. Note that the test circuit 108a may be formed not including the reconfigurable block 111[2].

In the case where a data signal is input to the terminals TLa and a test signal is output from the terminals TLb, a data signal is input to a programmable logic circuit PLC[1, k] (k is an integer of 3 to 12) and a test signal is output from the programmable logic circuit PLC[1, k] in FIG. 17. That is, a terminal TLa[k] and a terminal TLb[k] are both connected to the programmable logic circuit PLC[1, k].

Other structures can be employed as well. For example, a structure in which the terminal TLa[k] is connected to the programmable logic circuit PLC[1, k] and the terminal TLb[k] is connected to a programmable logic circuit PLC[2, k] or a structure in which the terminal TLa[k] is connected to the programmable logic circuit PLC[2, k] and the terminal TLb[k] is connected to the programmable logic circuit PLC[1, k] may be employed.

In testing a memory cell, the corresponding part of this device can form the test circuit 108a and the other part can form a different circuit. During the period other than the test period, the whole or part of this device can be made to have a function other than the function of the test circuit 108a; thus, use efficiency of the circuit can be increased.

A data processing device 100p illustrated in FIG. 18 includes the switch array 104f which is similar to that included in the data processing device 100h. In other words, the switch array 104f is provided with the switch group 109, and the bit lines BL[1] to BL[10] can be separated by the switch group 109 in normal operation. By utilizing this characteristics, a region of the switch array 104f that is the far side from the memory cell array 101 can be used as an inter-connect matrix.

The data processing device 100p includes the reconfigurable block 111[1], the reconfigurable block 111 [2], and the inter-connect matrix 112, and the whole or part of the data processing device 100p can constitute a test circuit. In the test of a memory cell, the test circuit is connected to the memory cell array 101 by turning on the switch group 109, and in normal operation, the test circuit is disconnected from the memory cell array 101 by turning off the switch group 109.

Since a signal irrelevant to the memory cell array can be transmitted to the region of the switch array 104f that is disconnected from the memory cell array 101, the region can be used as an inter-connect matrix. FIG. 18 illustrates the data processing device 100p during normal operation.

In this example, a reconfigurable block 111[3] is provided in addition to the reconfigurable blocks 111[1] and 111[2] and the inter-connect matrix 112. The region of the switch array 104f that is disconnected from the memory cell array 101 by the switch group 109 can be programmed to form a circuit having a function other than the function of the test circuit. Most of the switch array 104f can be utilized for certain functions; accordingly, use efficiency of the circuit can be further increased. Note that by stopping power supply to a programmable logic circuit PLC that does not contribute to operation in the test and normal operation, power consumption can be reduced.

Embodiment 5

Figure 19A:
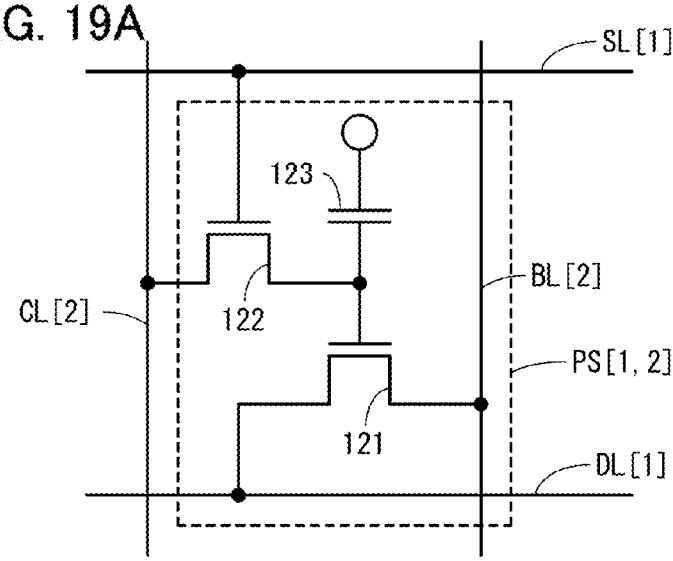
FIGS. 19A and 19B illustrate a structural example of a data processing device.

In this embodiment, an example of the programmable switch PS that can be used in Embodiments 1 to 4 will be described. FIG. 19A is a circuit diagram of a programmable switch PS[1, 2] including a switch transistor 121, a selection transistor 122, and a capacitor 123. Note that the capacitor 123 does not have to be intentionally provided in some cases.

One of a source and a drain of the switch transistor 121 is connected to a data line DL[1], and the other is connected to a bit line BL[2]. One of a source and a drain of the selection transistor 122 is connected to a configuration line CL[2], and the other is connected to a gate of the switch transistor 121 and one electrode of the capacitor 123. A gate of the selection transistor 122 is connected to a selection line SL[1].

An operation of this programmable switch PS will be described. It is assumed here that the switch transistor 121 and the selection transistor 122 are both n-channel transistors.

For example, in the case of making the programmable switch PS in a connected state, the potential of the gate of the switch transistor 121 is set higher than the potential at which the switch transistor 121 is turned on. To make this state, the selection transistor 122 is turned on and, in addition, the potential of the configuration line CL is set higher than or equal to the potential at which the switch transistor 121 is turned on. At this time, an effective channel is formed in the switch transistor 121.

At this time, the potentials of the data line DL (or a wiring corresponding to the data line DL) and the bit line BL are both set lower than the potential of the gate of the switch transistor 121. For example, they may be the lowest potential that is supplied to the data line DL and the bit line BL. For example, if the potentials supplied to the data line DL and the bit line BL are H and L (H>L), they are set to L.

Note that in the case of making the programmable switch PS in an insulated state, the potential of the gate of the switch transistor 121 is set at a potential at which the switch transistor 121 is in an off state. To make this state, the selection transistor 122 is turned on and, in addition, the potential of the configuration line CL is set at a potential at which the switch transistor 121 is in an off state.

Then, the selection transistor 122 is turned off. The transistors including an oxide semiconductor disclosed in Patent Documents 3 and 4 have an extremely small current between a source and a drain in an off state. When any one of such transistors is used as the selection transistor 122, the potential of the gate of the switch transistor 121 can be maintained at a necessary value for a sufficiently long period. At this time, since the gate of the switch transistor 121 is in a floating state, if the channel is formed, the potential of the gate might be varied owing to the potential of the channel.

Next, it is assumed that either of the potential of the bit line BL and the potential of the data line DL is increased from L to H. Here, the potential of the data line is assumed to be increased to H. If the programmable switch PS is in an insulated state, the bit line BL is insulated from the data line DL and the potential of the bit line does not change substantially. In contrast, if the programmable switch PS is in a connected state, first, the potential of the channel of the switch transistor 121 increases, which increases the potential of the gate of the switch transistor 121. The amount of this increase is smaller as the total capacitance connected to the gate of the switch transistor 121 including the capacitance of the capacitor 123 (with the exception of the capacitance of the data line DL) is larger, and the amount of this increase is larger as the capacitance between the gate and the channel of the switch transistor 121 (including the capacitances of the gate and the data line DL) is larger. Such an effect is called boosting, which is a phenomenon that does not occur in programmable switches used in general SRAM FPGAs or the like.

As a result, for example, when the potential of the gate of the switch transistor 121 is initially +0.9 V and the potential of the bit line BL and the data line DL are initially 0V, by an increase of the potential of the data line DL from 0 V to +0.9 V, the potential of the gate of the switch transistor 121 might increase to, for example, 1.4 V or more. If the threshold of the switch transistor 121 is 0.4 V, the potential of the bit line BL also increases to +0.9 V. If the capacitance of the capacitor 123 is too large and the potential of the gate of the switch transistor 121 does not increase at all, the potential of the bit line BL only increases to +0.5 V.

Figure 19B:
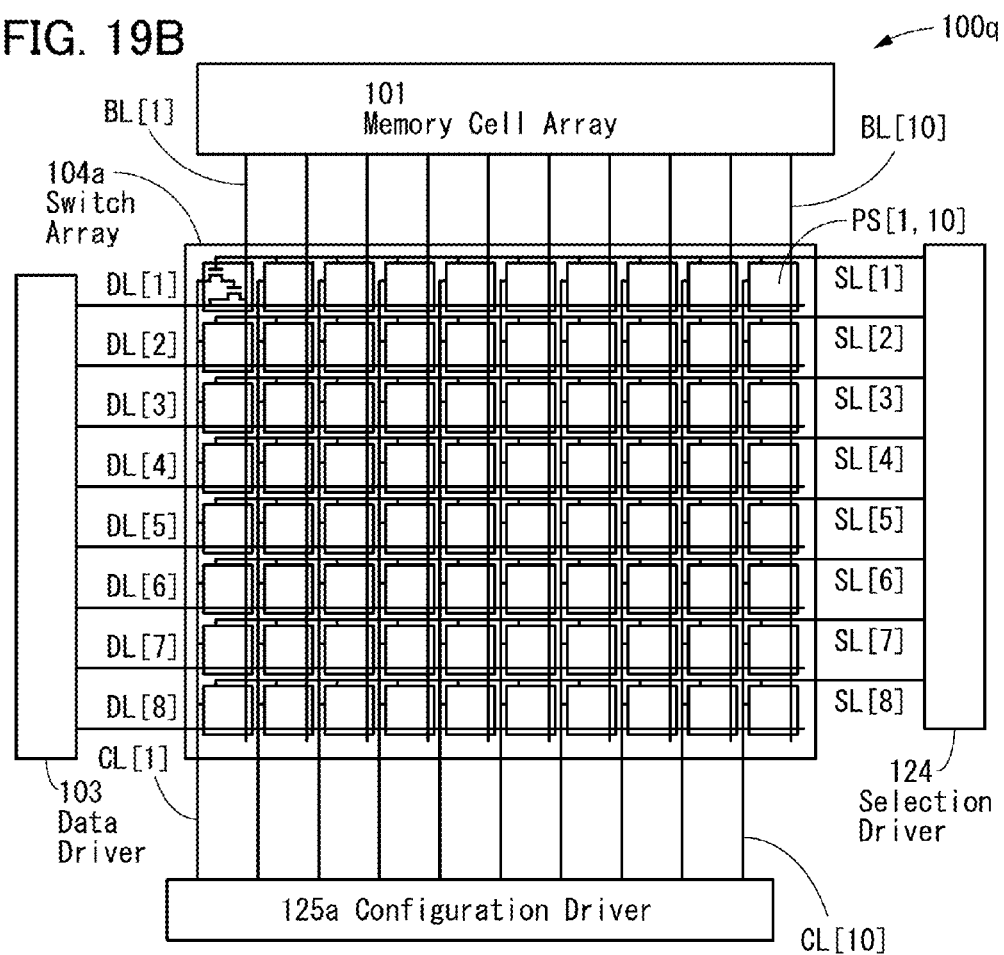

FIG. 19B illustrates a circuit structure of a data processing device 100q that includes selection lines SL, configuration lines CL, a selection driver 124 for driving the selection lines SL, and a configuration driver 125a for driving the configuration lines CL.

Figure 20A:
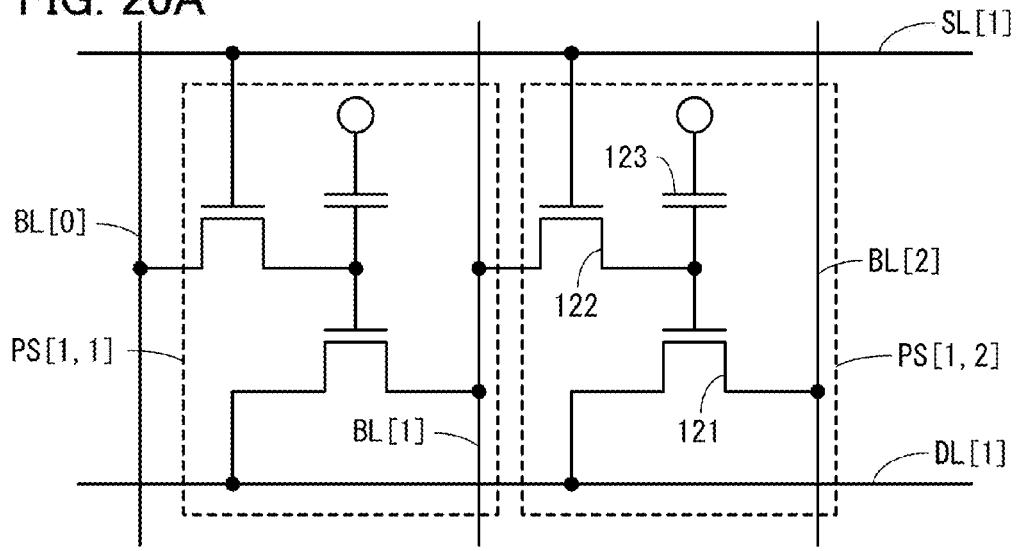
FIGS. 20A and 20B illustrate a structural example of a data processing device.

An example of using the bit lines BL that serve the functions of the configuration lines CL will be described with reference to FIGS. 20A and 20B. As illustrated in FIG. 20A, the structure of a programmable switch PS[1, 2] is almost the same as the structure illustrated in FIG. 19A but is different therefrom in that one of the source and the drain of the selection transistor 122 is connected to the bit line BL[1].

Since the bit lines BL used in the memory cell array 101 are the bit lines BL[1] to BL[10], for example, one of the source and the drain of the selection transistor 122 of the programmable switch PS[1, 1] is connected to a bit line BL[0] that is a dummy line.

Figure 20B:
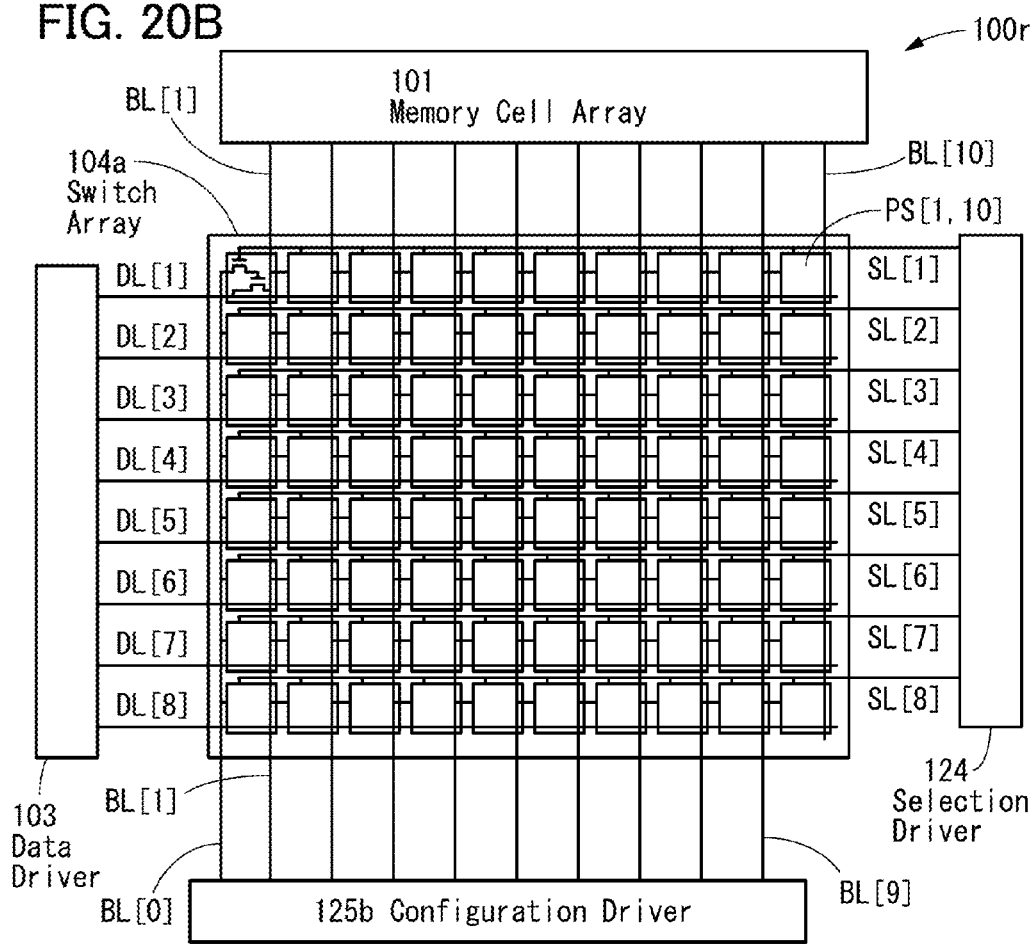

As illustrated in FIG. 20B, data is transmitted from a configuration driver 125b to the bit line BL[0] in a data processing device 100r. The bit line BL[10] is connected to memory cells but does not have to be connected to the configuration driver 125b.

The configuration driver 125b may have a function similar to that of the configuration driver 125a of the data processing device 100q but is required not to hinder the operation in the periods other than the programming period of the programmable switches PS (e.g., a test period of the memory cells or a period of normal operation). For example, in such periods, it is preferable that the configuration driver 125b be electrically disconnected from the bit lines BL[1] to BL[9].

Next, the boosting effect in the programmable switches PS used in the data processing device 100r will be described. In order to bring about the boosting effect in programming programmable switches PS in a row, it is required that the potential of only one bit line BL is H and the potentials of the other bit lines are all L and that the potential of the data line DL in the row (or the corresponding wiring) is L. In other words, programming is carried out so that only one of the programmable switches PS connected to one data line DL is in a connected state in the switch array 104a or the like.

As described in Embodiments 1 to 4, these conditions can be satisfied in almost all the cases. An assumable exception is that in the switch array 104f of the data processing device 100p (FIG. 18), the region disconnected from the memory cell array 101 by the switch group 109 may have a plurality of connected-state programmable switches PS in one row; however, by changing the circuit configuration, this state can be avoided.

On the assumption that the above conditions are satisfied, operation of the programmable switches PS[1, 1] and PS[1, 2] illustrated in FIG. 20A is considered. For example, the potential of the bit line BL[1] is set H. At this time, the potentials of the bit lines BL[0] and BL[2] have to be L and the potential of the data line DL[1] has to be L.

By turning on the selection transistor 122 in each of the programmable switches PS[1, 1] and PS[1, 2], the potential of the gate of the programmable switch PS[1, 2] becomes H to make the switch transistor 121 in an on state (a state in which an effective channel is formed). Since the potentials of the bit line BL[2] and the data line DL[1] are L, the conditions for producing the boosting effect are satisfied in the programmable switch PS[1, 2].

As for the programmable switch PS[1, 1], because the potential of the bit line BL[1] is H, the conditions for the boosting effect are not satisfied. However, since the potential of the bit line BL[1] is H, the potential of the bit line BL[0] needs to be L; therefore, the potential of the gate of the switch transistor 121 is L and the switch transistor 121 is in an off state (a state in which an effective channel is not formed). In other word, the boosting effect is unnecessary here.

In conclusion, the boosting effect can be produced in the programmable switches PS in the data processing device 100r.

Note that in programming the programmable switches PS in another row, the data line DL in the row is preferably set in a floating state. That is, the potential of the data line DL[k] is preferably set L only at the time of setting the programmable switches PS connected to the data line DL[k] and set in a floating state in the other period.

For example, in the case where a programmable switch PS[4, 3] is set in a connected state after a programmable switch PS[2, 2] is set in a connected state, the potential of the bit line BL[2] needs to be H.

If a data line DL[2] has some electrical connections (e.g., a connection to a wiring having L potential), a current flows between the bit line BL[2] and the data line DL[2] through the programmable switch PS[2, 2] in a connected state. However, if the data line DL[2] is in a floating state, such a short-circuit current does not flow.

Note that since the programmable switches PS except the programmable switch PS[2, 2] connected to the data line DL[2] are all in an off state, the bit line BL[2] is not connected to the other bit lines BL through the data line DL[2].

Embodiment 6

In this embodiment, a specific device structure of the data processing devices 100a to 100n and the data processing devices 100p to 100r in Embodiments 1 to 5 (hereinafter referred to as the data processing device 100) in the case of forming the data processing devices using a semiconductor device including an oxide semiconductor transistor (OS transistor) and a single-crystal silicon transistor (Si transistor) will be described.

<Device Structure>

Figure 21A:
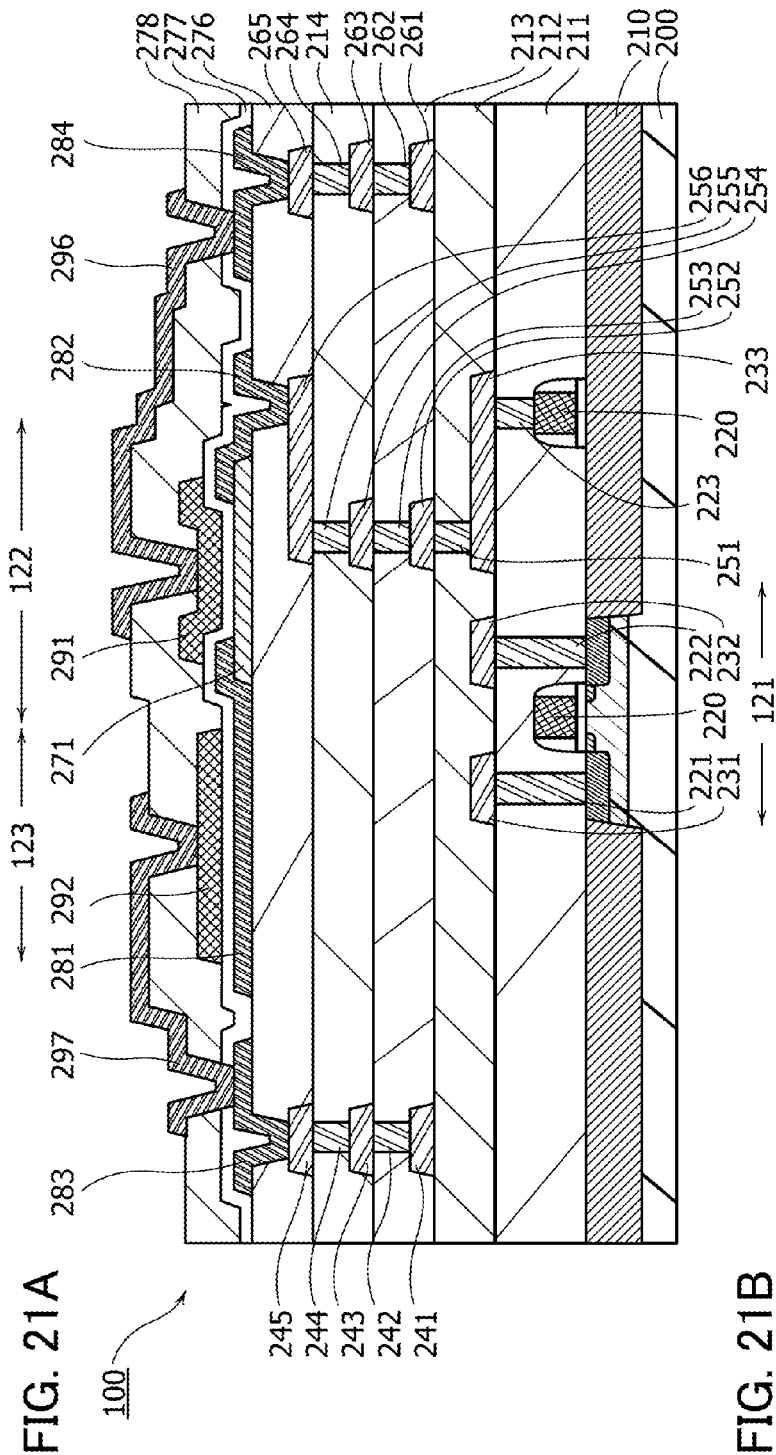
FIGS. 21A and 21B illustrate an example of a cross-sectional structure of a data processing device.

FIG. 21A is a cross-sectional view of an example of the device structure of the data processing device 100 as a semiconductor device including an OS transistor and a Si transistor. Note that FIG. 21A is not a view illustrating a particular cross section of the data processing device 100, but explains the layered structure of the data processing device 100. FIG. 21A illustrates the switch transistor 121, the selection transistor 122, and the capacitor 123 as typical components for forming a programmable switch PS of the data processing device 100. The switch transistor 121 is an n-channel Si transistor. The selection transistor 122 and the capacitor 123 are provided over the switch transistor 121.

The data processing device 100 is formed using a semiconductor substrate. A bulk single-crystal silicon wafer 200 is used as the semiconductor substrate. Note that the substrate of the data processing device 100 is not limited to the bulk single-crystal silicon wafer but can be any of a variety of semiconductor substrates. For example, an SOI semiconductor substrate including a single-crystal silicon layer may be used.

The switch transistor 121 can be formed over the single-crystal silicon wafer 200 by a CMOS process, together with other p-channel transistors (not illustrated). An insulating layer 210 electrically isolates these transistors from one another. An insulating layer 211 is formed so as to cover the switch transistor 121. Conductors 231 to 233 are formed over the insulating layer 211. Conductors 221 to 223 are formed in openings formed in the insulating layer 211. Note that one of the conductors 231 and 232 may be a bit line BL, and the other may be a data line DL.

One or more wiring layers are formed over the switch transistor 121 by the back end of the line (BEOL) process. Insulating layers 212 to 214 and conductors 241 to 245, 251 to 256, and 261 to 265 form a three-layered wiring structure.

An insulating layer 276 is formed to cover these wiring layers. The selection transistor 122 and the capacitor 123 are formed over the insulating layer 276.

The selection transistor 122 includes an oxide semiconductor layer 271, a conductor 281, a conductor 282, and a conductor 291. The oxide semiconductor layer 271 includes a channel formation region. The conductor 291 serves as a gate electrode. The conductors 281 and 282 each serve as either of a source and a drain electrodes. The conductor 282 is connected to the gate (conductor 220) of the switch transistor 121 via the conductors 223, 233, and 251 to 256. Although two conductors 220 are illustrated in FIG. 21A, these are one continuous conductor.

The capacitor 123 is a MIM capacitor, including the conductor 281 and a conductor 292 as electrodes and an insulating layer 277 as a dielectric (insulating film). The insulating layer 277 also serves as an insulator included in a gate insulating layer of the selection transistor 122.

An insulating layer 278 is formed to cover the selection transistor 122 and the capacitor 123. Conductors 296 and 297 are formed over the insulating layer 278. The conductors 296 and 297 are connected to the selection transistor 122 and the capacitor 123, respectively, and serve as electrodes (wirings) for connecting these elements to the layered wiring structure. For example, as illustrated, the conductor 296 is connected to the conductor 261 by the conductors 262 to 265 and a conductor 284. The conductor 297 is connected to the conductor 241 by the conductors 242 to 245 and a conductor 283.

The films included in the semiconductor device (i.e., the insulating film, the semiconductor film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. A coating method or a printing method can be used. As the CVD method, a plasma-enhanced chemical vapor deposition (PECVD) method or a thermal CVD method is used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Each of the insulating layers of the data processing device 100 can be formed using one insulating film or two or more insulating films. Examples of such an insulating film include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film.

Note that in this specification, an oxynitride refers to a substance that contains more oxygen than nitrogen, and a nitride oxide refers to a substance that contains more nitrogen than oxygen.

Each of the conductors in the data processing device 100 can be formed using one conductive film or two or more conductive films. Such conductive films are metal films containing aluminum, chromium, copper, silver, gold, platinum, tantalum, nickel, titanium, molybdenum, tungsten, hafnium, vanadium, niobium, manganese, magnesium, zirconium, beryllium, and the like. Such conductive films can be an alloy film containing any of these metal elements as a component, a compound film containing any of these metal elements as a component, or a polycrystalline silicon film containing an impurity element such as phosphorus, or the like.

<Another Structure Example of Transistor>

The structures of the Si transistor and the OS transistor included in the semiconductor device are not limited to those in FIG. 21A. For example, the OS transistor may include a back gate. In that case, an insulating layer and a conductor that constitutes a back gate over the insulating layer may be formed between the conductors 245, 256, and 265 and the conductors 281 to 284.

Figure 21B:
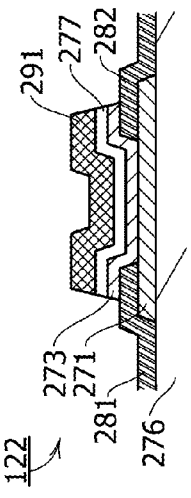

Alternatively, the OS transistor can have a structure as illustrated in FIG. 21B. In FIG. 21B, the selection transistor 122 further includes an oxide semiconductor layer 273. A channel is formed in the oxide semiconductor layer 271 also in the selection transistor 122 of FIG. 21B.

To form the selection transistor 122 of FIG. 21B, the conductors 281 and 282 are formed and then an oxide semiconductor film for the oxide semiconductor layer 273, an insulating film for the insulating layer 277, and a conductive film for the conductor 291 are stacked. These stacked films are etched using a resist mask for etching the conductive film, and the oxide semiconductor layer 273 and the conductor 291 are formed. Here, a region of the insulating layer 277 which is not covered with the conductor 292 is removed in the capacitor 123.

For example, in the selection transistor 122 in FIG. 21A, the oxide semiconductor layer 271 is formed of two layers of oxide semiconductor films having different constituent elements. In this case, the lower layer is formed using an In—Zn-based oxide film and the upper layer is formed using an In—Ga—Zn-based oxide film, or each of the lower layer and the upper layer may be formed using an In—Ga—Zn-based oxide film.

For example, in the case where the oxide semiconductor layer 271 is formed using two In—Ga—Zn-based oxide films, one of the films can be formed using an oxide film with an atomic ratio of In:Ga:Zn=1:1:1, 5:5:6, or 3:1:2, and the other of the films can be formed using an oxide film with an atomic ratio of In:Ga:Zn=1:3:2, 1:3:4, 1:3:6, 1:6:4, or 1:9:6.

In FIG. 21B, when the oxide semiconductor layer 271 has a two-layer structure and the oxide semiconductor layer 273 has a single-layer structure, the selection transistor 122 may be formed using an oxide semiconductor film with a three-layer structure. Also in this case, all or part of the three layers may be formed using oxide semiconductor films including different constituent elements, or the three layers may be formed using oxide semiconductor films including the same constituent element.

For example, in the case where each of the oxide semiconductor layers 271 and 273 is formed using an In—Ga—Zn-based oxide film, each of the lower layer of the oxide semiconductor layer 271 and the oxide semiconductor layer 273 can be formed using an oxide film with an atomic ratio of In:Ga:Zn=1:3:2, 1:3:4, 1:3:6, 1:6:4, or 1:9:6, and the upper layer of the oxide semiconductor layer 271 can be formed using an oxide film with an atomic ratio of In:Ga:Zn=1:1:1, 5:5:6, or 3:1:2.

Figure 22:
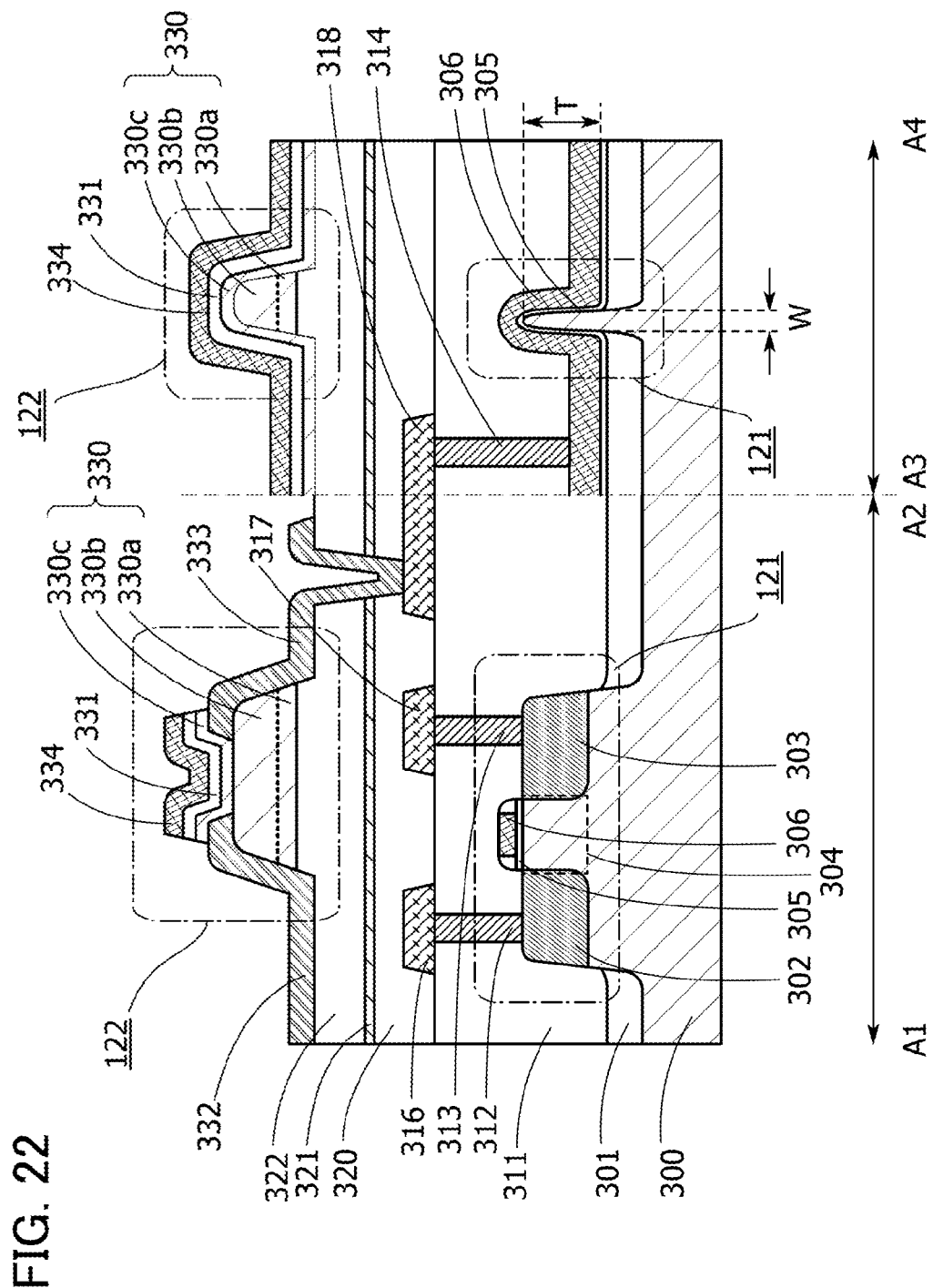
FIG. 22 illustrates an example of a cross-sectional structure of a data processing device.

FIG. 22 illustrates another structure example of a Si transistor and an OS transistor.

FIG. 22 is a cross-sectional view showing another structure example of a Si transistor and an OS transistor. In FIG. 22, the cross section A1-A2 shows the switch transistor 121 that is a Si transistor and the selection transistor 122 that is an OS transistor in the channel length direction (the direction from the source to the drain), and the cross section A3-A4 shows these transistors in the channel width direction (the direction perpendicular to the channel length direction). Note that in the layout, the channel length direction of the switch transistor 121 does not necessarily agree with that of the selection transistor 122. FIG. 22 is for illustrating a stacked structure. In FIG. 22, the selection transistor 122 that is an OS transistor including a channel formation region in an oxide semiconductor film is formed over the switch transistor 121 including a single-crystal silicon channel formation region. A single crystal silicon substrate is used as a substrate 300 in FIG. 22.

The switch transistor 121 is electrically isolated from other semiconductor elements by an element isolation method. As the element isolation method, a trench isolation method (a shallow trench isolation (STI) method) or the like is used. FIG. 22 illustrates an example where the trench isolation method is used to electrically isolate the switch transistor 121. Specifically, FIG. 22 shows an example in which the switch transistor 121 is isolated using an element isolation region 301. The element isolation region 301 is formed in the following manner: a trench which is formed in the substrate 300 by etching or the like is filled with an insulator including silicon oxide or the like, and then, the insulator is partially removed by etching or the like.

In a projection of the semiconductor substrate 300 that exists in a region other than the trench, an impurity region 302 and an impurity region 303 of the switch transistor 121 and a channel formation region 304 placed between the impurity regions 302 and 303 are provided. The switch transistor 121 also includes an insulating layer 305 covering the channel formation region 304 and a gate electrode 306 that overlaps with the channel formation region 304 with the insulating layer 305 placed therebetween.

In the switch transistor 121, a side portion and an upper portion of the projection in the channel formation region 304 overlap with the gate electrode 306 with the insulating layer 305 positioned therebetween, so that carriers flow in a wide area including a side portion and an upper portion of the channel formation region 304. Thus, the amount of transfer of carriers in the switch transistor 121 can be increased with the area of the switch transistor 121 in the substrate kept small. As a result, the on-state current of the switch transistor 121 is increased and the field-effect mobility is increased. Suppose the length of the projection of the channel formation region 304 in the channel width direction (i.e., channel width) is W and the thickness of the projection of the channel formation region 304 is T. When the aspect ratio that corresponds to the ratio of the thickness T to the channel width W is high, a region where carrier flows becomes wider. Thus, the on-state current of the switch transistor 121 is further increased and the field-effect mobility of the switch transistor 121 is further increased.

Note that when the switch transistor 121 is formed using a bulk semiconductor substrate, the aspect ratio is desirably 0.5 or more, further desirably 1 or more.

An insulating layer 311 is provided over the switch transistor 121. Openings are formed in the insulating layer 311. A conductor 312, a conductor 313, and a conductor 314 that are electrically connected to the impurity region 302, the impurity region 303, and the gate electrode 306, respectively, are formed in the openings. The conductor 312 is electrically connected to a conductor 316 over the insulating layer 311. The conductor 313 is electrically connected to a conductor 317 over the insulating layer 311. The conductor 314 is electrically connected to a conductor 318 over the insulating layer 311.

An insulating layer 320 is provided over the conductors 316 to 318. An insulating layer 321 having an effect of blocking diffusion of oxygen, hydrogen, and water is provided over the insulating layer 320. An insulating layer 322 is provided over the insulating layer 321. The selection transistor 122 is provided over the insulating layer 322.

As the insulating layer 321 has higher density and becomes denser or has a fewer dangling bonds and becomes more chemically stable, the insulating layer 321 has a higher blocking effect. The insulating layer 321 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating layer 321 having an effect of blocking diffusion of hydrogen and water can be formed using silicon nitride or silicon nitride oxide, for example.

The selection transistor 122 includes an oxide semiconductor layer 330, conductors 332 and 333 in contact with the oxide semiconductor layer 330, an insulating layer 331 covering the oxide semiconductor layer 330, and a gate electrode 334 that overlaps with the oxide semiconductor layer 330 with the insulating layer 331 placed therebetween. The conductors 332 and 333 function as source and drain electrodes. The conductor 333 is connected to the conductor 318 in an opening formed in the insulating layers 320 to 322.

Although not illustrated, an insulating layer may be provided over the selection transistor 122. In this case, it is possible that an opening is formed in the insulating layer and a conductor that is in contact with the gate electrode 334 in the opening is provided over the insulating layer.

Note that in FIG. 22, the selection transistor 122 includes the gate electrode 334 on at least one side of the oxide semiconductor layer 330. The selection transistor 122 may also include a gate electrode that overlaps with the oxide semiconductor layer 330 with the insulating layer 322 placed therebetween.

When the selection transistor 122 includes a pair of gate electrodes, one of the gate electrodes may be supplied with a signal for controlling the on/off state, and the other of the gate electrodes may be supplied with another potential independently of the one of the gate electrodes. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 22, the selection transistor 122 has a single-channel structure where one channel formation region corresponding to one gate electrode 334 is provided. When a plurality of gate electrodes electrically connected to each other are provided in the selection transistor 122, for example, the selection transistor 122 can have a multi-channel structure where a plurality of channel formation regions are included in one oxide semiconductor layer.

FIG. 22 is an example in which the oxide semiconductor layer 330 of the selection transistor 122 has a three-layered structure of oxide semiconductor layers 330a to 330c. After the oxide semiconductor layers 330a and 330b are formed, the conductors 332 and 333 are formed, and then the oxide semiconductor layer 330c is formed. Note that one or two of the oxide semiconductor layers 330a to 330c may be omitted.

Embodiment 7

In this embodiment, the oxide semiconductor used in the OS transistor will be described.

The channel formation region of the OS transistor is preferably formed using a highly purified oxide semiconductor (purified OS). A purified OS refers to an oxide semiconductor obtained by reduction of impurities such as moisture or hydrogen that serve as electron donors (donors) and reduction of oxygen vacancies. By highly purifying an oxide semiconductor in this manner, the conductivity type of the oxide semiconductor can be intrinsic or substantially intrinsic. The term "substantially intrinsic" means that the carrier density of an oxide semiconductor is lower than $1\times10^{17}/cm^3$. The carrier density is preferably lower than $1\times10^{15}/cm^3$, further preferably lower than $1\times10^{13}/cm^3$, particularly preferably lower than $8\times10^{11}/cm^3$, still further preferably lower than $1\times10^{11}/cm^3$, yet further preferably lower than $1\times10^{10}/cm^3$, and is $1\times10^{-9}/cm^3$ or higher.

By forming the channel formation region using a purified OS, the normalized off-state current of the OS transistor can be as low as several yoctoamperes per micrometer to several zeptoamperes per micrometer at room temperature.

In the oxide semiconductor, hydrogen, nitrogen, carbon, silicon, and metal elements that are not main components are impurities. For example, hydrogen and nitrogen form donor levels to increase the carrier density. Silicon forms impurity levels in the oxide semiconductor. The impurity levels become traps, which might degrade the electrical characteristics of the OS transistor. It is preferable to reduce the concentration of the impurities in the oxide semiconductor and at an interface with another layer.

To make the oxide semiconductor intrinsic or substantially intrinsic, the oxide semiconductor is preferably highly purified to approximately any of the following impurity concentration levels. The following impurity concentrations are obtained by secondary ion mass spectrometry (SIMS) analysis at a certain depth of an oxide semiconductor layer or in a certain region of the oxide semiconductor. The purified OS has any of the following impurity concentration levels.

For example, in the case where the impurity includes silicon, the concentration of silicon is lower than $1\times10^{19}$ atoms/$cm^3$, preferably lower than $5\times10^{18}$ atoms/$cm^3$, further preferably lower than $1\times10^{18}$ atoms/$cm^3$.

For example, in the case where the impurity includes hydrogen, the concentration of hydrogen is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$.

For example, in the case where the impurity includes nitrogen, the concentration of nitrogen is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

In the case where the oxide semiconductor including crystals contains silicon or carbon at high concentration, the crystallinity of the oxide semiconductor might be lowered. In order not to lower the crystallinity of the oxide semiconductor, for example, the concentration of silicon is set lower than $1\times10^{19}$ atoms/$cm^3$, preferably lower than $5\times10^{18}$ atoms/$cm^3$, further preferably lower than $1\times10^{18}$ atoms/$cm^3$. For example, the concentration of carbon is set lower than $1\times10^{19}$ atoms/$cm^3$, preferably lower than $5\times10^{18}$ atoms/$cm^3$, further preferably lower than $1\times10^{18}$ atoms/$cm^3$.

As the oxide semiconductor used for the OS transistor, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide means an oxide containing In, Ga, and Zn, and there is no limitation on the ratio of In, Ga, and Zn. The In—Ga—Zn-based oxide may contain a metal element other than In, Ga, and Zn. An oxide semiconductor having an appropriate composition may be formed in accordance with needed electrical characteristics (e.g., field-effect mobility and threshold voltage).

For example, an In—Ga—Zn-based oxide with an atomic ratio of In:Ga:Zn=1:1:1, In:Ga:Zn=1:3:2, In:Ga:Zn=3:1:2, or In:Ga:Zn=2:1:3, or an oxide whose composition is in the neighborhood of the above composition is preferably used. In this specification, the atomic ratio of the oxide semiconductor varies within a range of ±20% as an error.

For example, in the case where an In—Ga—Zn-based oxide is formed by sputtering, it is preferable to use an In—Ga—Zn-based oxide target with an atomic ratio of In:Ga:Zn=1:1:1, 5:5:6, 4:2:3, 3:1:2, 1:1:2, 2:1:3, 1:3:2, 1:3:4, 1:4:4, 1:6:4, or 3:1:4 as an In—Ga—Zn-based oxide deposition target. When an In—Ga—Zn-based oxide semiconductor film is deposited using such a target, a crystal part is formed in the oxide semiconductor film easily. The filling factor (relative density) of such a target is preferably higher than or equal to 90%, further preferably higher than or equal to 95%. With a target having a high filling factor, a dense oxide semiconductor film can be deposited.

For example, it is preferable to use an In—Zn-based oxide target with an atomic ratio of In:Zn=50:1 to 1:2 (a molar ratio of $In_2O_3$:ZnO=25:1 to 1:4) as an In—Zn-based oxide deposition target. The atomic ratio of In:Zn is preferably 15:1 to 1.5:1 (the molar ratio of $In_2O_3$:ZnO=3:4 to 15:2). For example, in an In—Zn-based oxide deposition target with an atomic ratio of In:Zn:O=X:Y:Z, the relation Z>1.5X+Y is preferably satisfied. The mobility of an In—Zn-based oxide film can be increased by keeping the ratio of Zn within the above range.

<Structure of Oxide Semiconductor Film>

A structure of the oxide semiconductor film is described below. In the following description, the term "parallel" indicates that the angle formed between two straight lines is greater than or equal to −10° and less than or equal to 10°, and accordingly also includes the case where the angle is greater than or equal to −5° and less than or equal to 5°. The term "substantially perpendicular" indicates that the angle formed between two straight lines is greater than or equal to 80° and less than or equal to 100°, and accordingly also includes the case where the angle is greater than or equal to 85° and less than or equal to 95°. Further, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

<CAAC-OS Film>

First, a CAAC-OS film is described.

The CAAC-OS film is an oxide semiconductor film including a plurality of c-axis aligned crystal parts.

In a transmission electron microscope (TEM) image of the CAAC-OS film, a boundary between crystal parts, that is, a clear grain boundary is not observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, such a surface is referred to as a formation surface) or a top surface of the CAAC-OS film, and is arranged parallel to the formation surface or the top surface of the CAAC-OS film.

In contrast, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

Figure 23A:
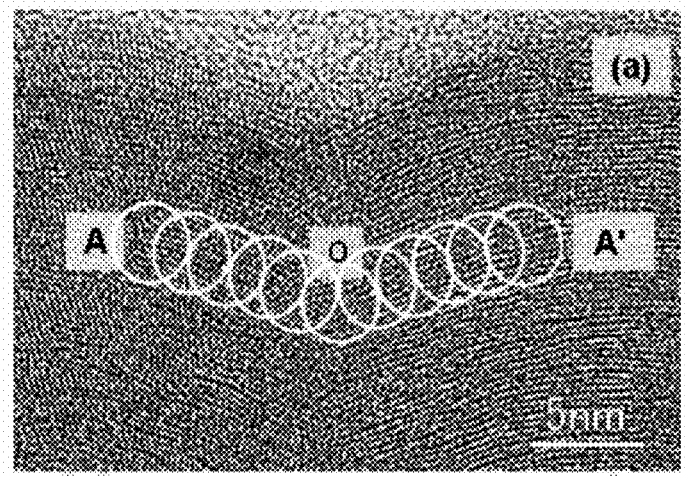
FIGS. 23A to 23C illustrate an example of a structure of an oxide semiconductor.
Figure 23B:

FIG. 23A is a cross-sectional TEM image of a CAAC-OS film. FIG. 23B is a cross-sectional TEM image obtained by enlarging the image of FIG. 23A. In FIG. 23B, atomic arrangement is highlighted for easy understanding.

Figure 23C:
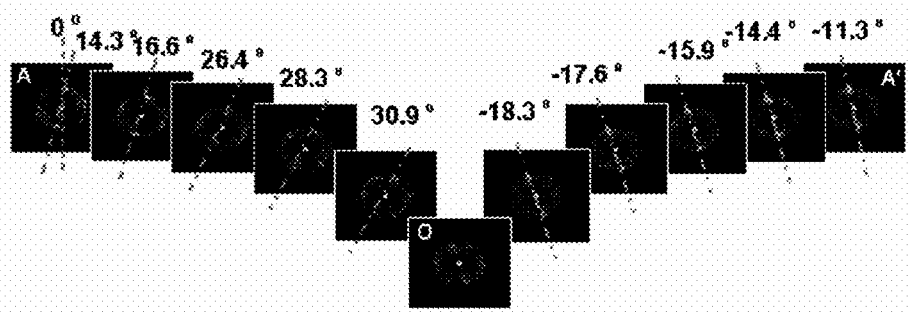

FIG. 23C is Fourier transform images of regions each surrounded by a circle (the diameter is approximately 4 nm) between A and O and between O and A' in FIG. 23A. C-axis alignment can be observed in each region in FIG. 23C. The c-axis direction between A and O is different from that between O and A', which indicates that a grain in the region between A and O is different from that between O and A'. In addition, between A and O, the angle of the c-axis continuously and gradually changes from 14.3°, 16.6°, to 30.9°. Similarly, between O and A', the angle of the c-axis continuously changes from −18.3°, −17.6°, to −11.3°.

Figure 24A:
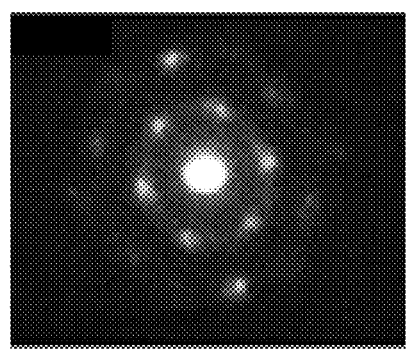
FIGS. 24A to 24D each illustrate an example of a structure of an oxide semiconductor.

Note that in an electron diffraction pattern of the CAAC-OS film, spots (luminescent spots) having alignment are shown. For example, spots are observed in an electron diffraction pattern (also referred to as a nanobeam electron diffraction pattern) of the top surface of the CAAC-OS film which is obtained using an electron beam with a diameter of, for example, larger than or equal to 1 nm and smaller than or equal to 30 nm (see FIG. 24A).

From the results of the cross-sectional TEM image and the plan TEM image, alignment is found in the crystal parts in the CAAC-OS film.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 nm$^2$, larger than or equal to 5 μm$^2$, or larger than or equal to 1000 μm$^2$ is observed in some cases in the planar TEM image.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. In contrast, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases.

Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak may also be observed at 2θ of around 36°, in addition to the peak at 2θ of around 31°. The peak at 2θ of around 36° indicates that a crystal having no c-axis alignment is included in part of the CAAC-OS film. It is preferable that in the CAAC-OS film, a peak appears at 2θ of around 31° and a peak do not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

In a transistor including the CAAC-OS film, changes in electrical characteristics of the transistor due to irradiation with visible light or ultraviolet light are small.

<Microcrystalline Oxide Semiconductor Film>

Next, a microcrystalline oxide semiconductor film is described. In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a crystal grain boundary cannot be found clearly in some cases.

Figure 24B:
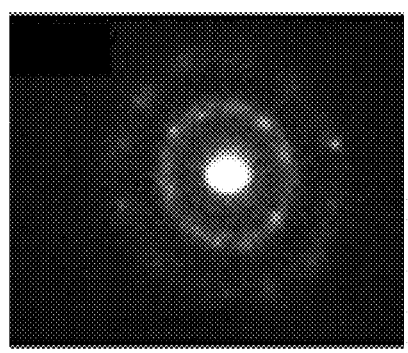

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 24B).

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

However, even when the oxide semiconductor film is a CAAC-OS film, a diffraction pattern that is partly similar to that of an nc-OS film is observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 24C:
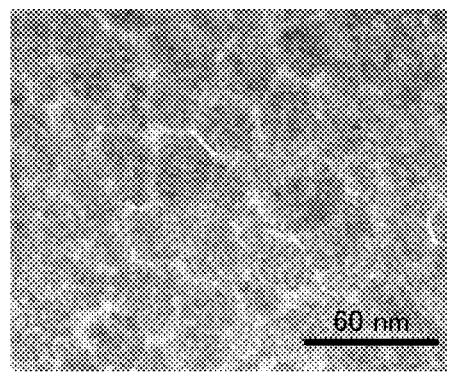
Figure 24D:
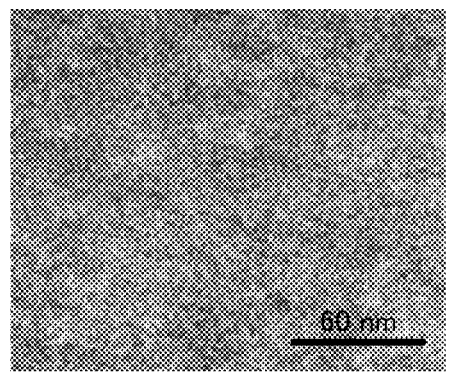

FIGS. 24C and 24D are planar TEM images of the CAAC-OS film obtained just after the deposition (as-sputtered) and the CAAC-OS film subjected to the heat treatment at 450° C., respectively. Comparison between FIGS. 24C and 24D shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Embodiment 8

The above-described data processing devices can be used in various semiconductor devices and electronic devices. Examples of such electronic devices are personal computers and image reproducing devices provided with recording media (devices that read image data of recording media such as digital versatile discs (DVDs) and have displays for displaying images). Other examples are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 25A to 25F illustrate specific examples of these electronic devices.

Figure 25A:
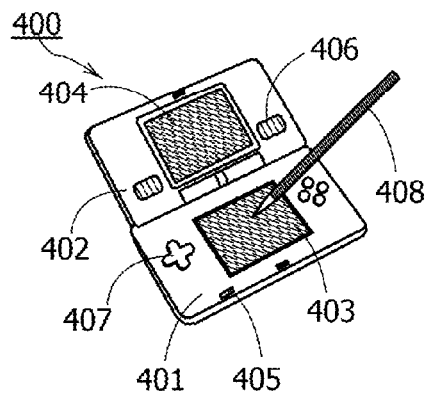
FIGS. 25A to 25F illustrate electronic devices each including a data processing device.

FIG. 25A is an external view illustrating a structure example of a portable game machine. A portable game machine 400 includes a housing 401, a housing 402, a display portion 403, a display portion 404, a microphone 405, speakers 406, an operation key 407, a stylus 408, and the like.

Figure 25B:
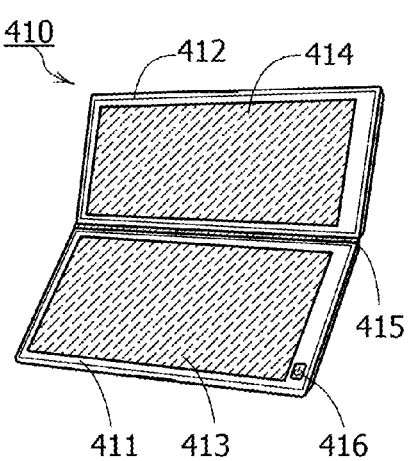

FIG. 25B is an external view illustrating a structure example of a portable information terminal. A portable information terminal 410 includes a housing 411, a housing 412, a display portion 413, a display portion 414, a joint 415, an operation key 416, and the like. The display portion 413 is provided in the housing 411, and the display portion 414 is provided in the housing 412. The housings 411 and 412 are connected to each other with the joint 415, and the angle between the housings 411 and 412 can be changed with the joint 415. Images displayed on the display portion 413 may be switched in accordance with the angle at the joint 415 between the housing 411 and the housing 412. Note that the display portion 413 and/or the display portion 414 may be touch panels.

Figure 25C:
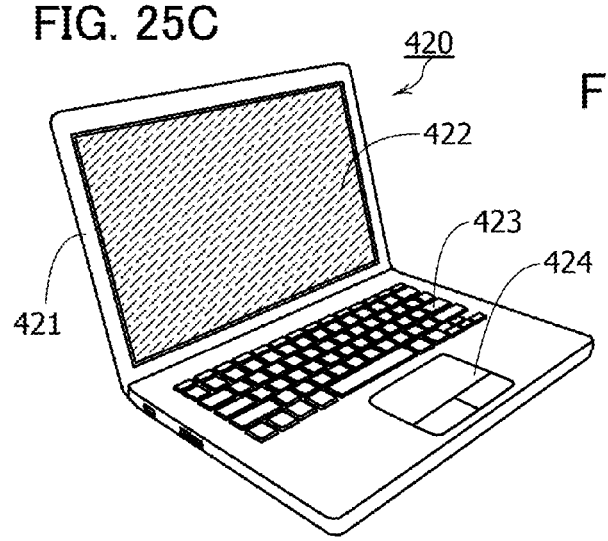

FIG. 25C is an external view illustrating a structure example of a laptop. A personal computer 420 includes a housing 421, a display portion 422, a keyboard 423, a pointing device 424, and the like.

Figure 25D:
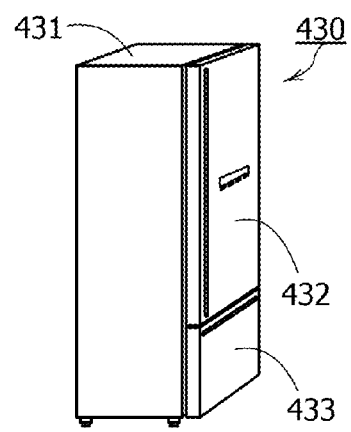

FIG. 25D is an external view illustrating a structure example of an electric refrigerator-freezer. The electric refrigerator-freezer 430 includes a housing 431, a refrigerator door 432, a freezer door 433, and the like.

Figure 25E:
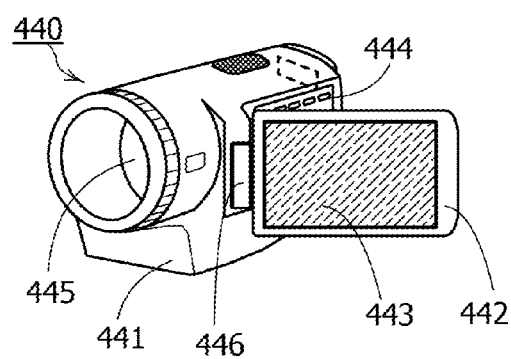

FIG. 25E is an external view illustrating a structure example of a video camera. The video camera 440 includes a housing 441, a housing 442, a display portion 443, operation keys 444, a lens 445, a joint 446, and the like. The operation keys 444 and the lens 445 are provided in the housing 441, and the display portion 443 is provided in the housing 442. The housing 441 and the housing 442 are connected to each other with the joint 446, and the angle between the housing 441 and the housing 442 can be changed with the joint 446. The direction of an image on the display portion 443 may be changed and display and non-display of an image may be switched depending on the angle between the housing 441 and the housing 442.

Figure 25F:
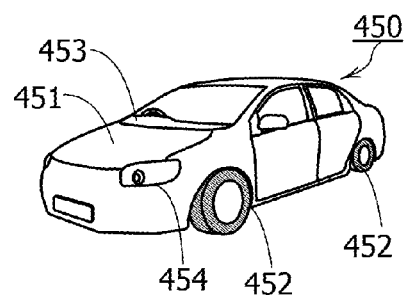

FIG. 25F is an external view illustrating a structure example of a motor vehicle. The motor vehicle 450 includes a car body 451, wheels 452, a dashboard 453, lights 454, and the like.

The data processing devices in the above embodiments can be used in a cache memory, a main memory, or a storage of various kinds of arithmetic processing unit (e.g., a CPU, a microcontroller, a programmable device such as an FPGA, and an RFID tag).

This embodiment can be implemented in appropriate combination with any of the other embodiments.

This application is based on Japanese Patent Application serial no. 2013-231864 filed with Japan Patent Office on Nov. 8, 2013, the entire contents of which are hereby incorporated by reference.

What is claimed is:

1. A data processing device comprising:
a memory cell array comprising a first wiring; and
a switch array operationally connected to the memory cell array, the switch array comprising:
a plurality of first programmable switches; and
the first wiring,
wherein the switch array is configured to transmit a test signal to the memory cell array in an operation for detecting a defective memory cell in the memory cell array, and
wherein the switch array is configured to prevent data transmission to the defective memory cell.

2. A data processing device according to claim 1,
wherein the memory cell array comprises:
a plurality of first wirings including the first wiring;
a plurality of second wirings; and
a plurality of memory cells at intersections between the plurality of first wirings and the plurality of second wirings, wherein the switch array comprises:
the plurality of first wirings; and
a plurality of third wirings,
wherein the plurality of first programmable switches is at intersections between the plurality of first wirings and the plurality of third wirings, and
wherein the plurality of first programmable switches is each configured to electrically connect one of the plurality of first wirings to one of the plurality of third wirings.

3. The data processing device according to claim 2, wherein the plurality of first wirings are bit lines and the plurality of second wirings are word lines.

4. The data processing device according to claim 2, wherein the number of the plurality of third wirings is larger than the number of the plurality of first wirings.

5. The data processing device according to claim 2, wherein at least one of the plurality of third wirings is not electrically connected to any of the plurality of first wirings.

6. The data processing device according to claim 2,
wherein the plurality of first programmable switches each comprises a first transistor and a second transistor,
wherein one of a source and a drain of the first transistor is electrically connected to one of the plurality of third wirings,
wherein the other of the source and the drain of the first transistor is electrically connected to one of the plurality of first wirings,
wherein a gate of the first transistor is electrically connected to one of a source and a drain of the second transistor,
wherein the second transistor comprises a channel formation region, and
wherein the channel formation region includes an oxide semiconductor.

7. The data processing device according to claim 2, further comprising:
a plurality of fourth wirings intersecting with the plurality of first wirings;
a plurality of second programmable switches at intersections between the plurality of fourth wirings and the plurality of first wirings, the plurality of second programmable switches each being configured to electrically connect one of the plurality of fourth wirings to one of the plurality of first wirings; and
a driver circuit configured to supply a signal to the plurality of fourth wirings.

8. The data processing device according to claim 7, wherein the driver circuit is a test circuit configured to transmit and receive the test signal.

9. The data processing device according to claim 7, wherein the driver circuit comprises at least one programmable logic circuit.

10. A data processing device comprising:
a plurality of first wirings;
a plurality of second wirings;
a plurality of third wirings;
a memory cell array comprising a plurality of memory cells at intersections between the plurality of first wirings and the plurality of third wirings;
a switch array comprising a plurality of first programmable switches at intersections between the plurality of second wirings and the plurality of third wirings, the plurality of first programmable switches each being configured to electrically connect one of the plurality of second wirings to one of the plurality of third wirings;
a first driver circuit configured to supply a signal to the plurality of first wirings; and
a second driver circuit configured to supply a signal to the plurality of second wirings,
wherein the number of the plurality of second wirings is larger than the number of the plurality of third wirings.

11. The data processing device according to claim 10, wherein the plurality of first wirings are word lines and the plurality of third wirings are bit lines.

12. The data processing device according to claim 10, wherein at least one of the plurality of second wirings is not electrically connected to any of the plurality of third wirings.

13. The data processing device according to claim 10,
wherein the plurality of first programmable switches each comprises a first transistor and a second transistor,
wherein one of a source and a drain of the first transistor is electrically connected to one of the plurality of second wirings,
wherein the other of the source and the drain of the first transistor is electrically connected to one of the plurality of third wirings,
wherein a gate of the first transistor is electrically connected to one of a source and a drain of the second transistor,
wherein the second transistor comprises a channel formation region, and
wherein the channel formation region includes an oxide semiconductor.

14. The data processing device according to claim 10, further comprising:
a plurality of fourth wirings intersecting with the plurality of third wirings;
a plurality of second programmable switches at intersections between the plurality of fourth wirings and the plurality of third wirings, the plurality of second programmable switches each being configured to electrically connect one of the plurality of fourth wirings to one of the plurality of third wirings; and
a third driver circuit configured to supply a signal to the plurality of fourth wirings.

15. The data processing device according to claim 14, wherein the third driver circuit is a test circuit configured to transmit and receive a test signal.

16. The data processing device according to claim 14, wherein the third driver circuit comprises at least one programmable logic circuit.

17. A method for manufacturing the data processing device according to claim 10, comprising the steps of:
testing the plurality of memory cells; and
programming the plurality of first programmable switches when a defective memory cell is detected in the testing step so that one of the plurality of third wirings electrically connected to the defective memory cell is not electrically connected to any of the plurality of second wirings, and each one of the rest of the plurality of third wirings is electrically connected to each corresponding one of the plurality of second wirings.

* * * * *